(12) United States Patent
Chen et al.

(10) Patent No.: US 11,227,984 B2
(45) Date of Patent: Jan. 18, 2022

(54) DISPLAY DEVICE HAVING A PLURALITY OF MAIN PADS, A PLURALITY OF REDUNDANT PADS, AND A LIGHT-EMITTING DEVICE IN A DISPLAY AREA

(71) Applicant: InnoLux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW); Yuan-Lin Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 5 days.

(21) Appl. No.: 16/783,397

(22) Filed: Feb. 6, 2020

(65) Prior Publication Data
US 2020/0176658 A1   Jun. 4, 2020

Related U.S. Application Data

(63) Continuation of application No. 16/013,074, filed on Jun. 20, 2018, now Pat. No. 10,593,852.

(51) Int. Cl.
| | |
|---|---|
| *H01L 33/62* | (2010.01) |
| *H01L 25/13* | (2006.01) |
| *H01L 33/06* | (2010.01) |
| *H01L 33/50* | (2010.01) |
| *H01L 33/58* | (2010.01) |
| *H01L 23/49* | (2006.01) |
| *H01L 25/075* | (2006.01) |
| *H01L 23/488* | (2006.01) |

(52) U.S. Cl.
CPC ........... *H01L 33/62* (2013.01); *H01L 25/13* (2013.01); *H01L 33/06* (2013.01); *H01L 33/505* (2013.01); *H01L 33/58* (2013.01); *H01L 23/488* (2013.01); *H01L 23/49* (2013.01); *H01L 25/0753* (2013.01)

(58) Field of Classification Search
CPC ........... H01L 27/3241; H01L 27/3244; H01L 27/3276; H01L 33/62; H01L 25/13; H01L 33/06; H01L 33/505; H01L 33/58; H01L 25/0753; H01L 23/488; H01L 23/49; G09F 9/33
See application file for complete search history.

(56) References Cited

U.S. PATENT DOCUMENTS

2018/0174973 A1*   6/2018   Aoyagi ................ H01L 25/167

\* cited by examiner

*Primary Examiner* — Ermias T Woldegeorgis
(74) *Attorney, Agent, or Firm* — McClure, Qualey & Rodack, LLP

(57) ABSTRACT

A display device is provided. The display device includes a substrate, a plurality of signal lines disposed on the substrate, and a plurality of display units disposed on the substrate. At least one of the signal lines includes a main line, a plurality of first branch lines electrically connected to the main line, and a plurality of second branch lines electrically connected to the main line. At least one of the display units includes a plurality of main pads, a plurality of redundant pads, and a light-emitting device electrically connected to the main pads. At least one of the main pads is electrically connected to at least one first branch line, and at least one of the redundant pads is electrically connected to at least one second branch line.

16 Claims, 16 Drawing Sheets

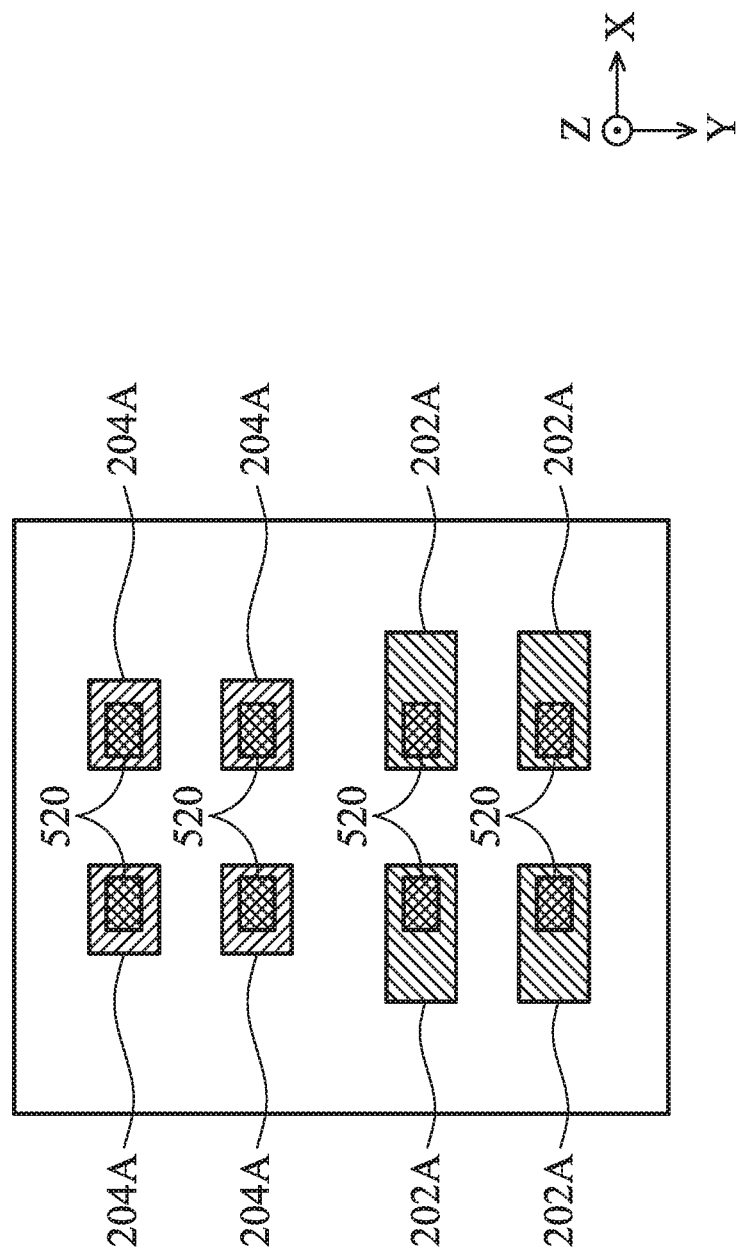

DISPLAY DEVICE HAVING A PLURALITY OF MAIN PADS, A PLURALITY OF REDUNDANT PADS, AND A LIGHT-EMITTING DEVICE IN A DISPLAY AREA

CROSS REFERENCE TO RELATED APPLICATIONS

This application is a Continuation of pending U.S. patent application Ser. No. 16/013,074, filed Jun. 20, 2018 and entitled "A DISPLAY DEVICE HAVING A PLURALITY OF MAIN PADS, A PLURALITY OF REDUNDANT PADS, AND A LIGHT-EMITTING DEVICE", the entirety of which is incorporated by reference herein.

BACKGROUND

Technical Field

The present disclosure relates to a display device, and it relates to the design of redundant pads in the display device.

Description of the Related Art

Electronic products that come with a display panel, such as smartphones, tablets, notebooks, monitors, and TVs, have become indispensable necessities in modern society. With the flourishing development of such portable electronic products, consumers have high expectations regarding the quality, functionality, and price of such products. The development of next-generation display devices has been focused on techniques that are energy-saving and environmentally friendly.

Micro LED technology is an emerging flat panel display technology. Micro LED displays drive an array of addressed micro LEDs. Micro LED displays can produce seamless images with a wide viewing angle, high brightness, and high contrast. However, due to the small size of a micro LED, integration and packaging issues are one of the main obstacles for commercialization of such products.

Using current manufacturing methods, micro LEDs are generally formed and divided into several micro LED dies (e.g., micro-lighting dies) on a wafer substrate and then transferred to another destination substrate. For example, the driving circuits and related circuits are formed on the destination substrate to provide an array substrate (e.g., a TFT array substrate), and the micro LED dies are then mounted on the array substrate. Due to the small size of micro LED dies, the electrical connection between the micro LED and the destination substrate often encounters many problems. For example, the micro LED dies can easily fall off of the destination substrate, and therefore the maintenance or repair of the electrical connection between the micro LED and the destination substrate is a problem that needs to be taken care of.

Accordingly, it is desirable to develop a structure and method that can effectively maintain or repair the electrical interconnection between a small electronic component such as a micro LED and a destination substrate.

SUMMARY

In accordance with some embodiments of the present disclosure, a display device is provided. The display device comprises a substrate and a plurality of signal lines disposed on the substrate. At least one of the signal lines comprises a main line, a plurality of first branch lines, and a plurality of second branch lines. The first branch lines are electrically connected to the main line. The second branch lines are electrically connected to the main line. A plurality of display units is disposed on the substrate. At least one of the display units comprises a plurality of main pads, a plurality of redundant pads, and a light-emitting device. The light-emitting device is electrically connected to the main pads. At least one of the main pads is electrically connected to at least one first branch line, and at least one redundant pad is electrically connected to at least one second branch line.

In accordance with some embodiments of the present disclosure, a display device is provided. The display device comprises a substrate and a plurality of signal lines. The signal lines are disposed on the substrate. One or more of the signal lines comprises a main line, a plurality of first branch lines, and a plurality of second branch lines. The first branch lines are electrically connected to the main line. The second branch lines are electrically connected to the main line. A plurality of display units is disposed on the substrate. One or more display unit comprises a plurality of main pads, a plurality of redundant pads, and a first light-emitting device. The first light-emitting device is electrically connected to the main pads. At least one main pad is electrically connected to one or more second branch lines, and at least one redundant pad is electrically disconnected to the first branch lines.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIG. 6B is a diagram of the top view of the display device in FIG. 6A.

DETAILED DESCRIPTION

Figure 1:
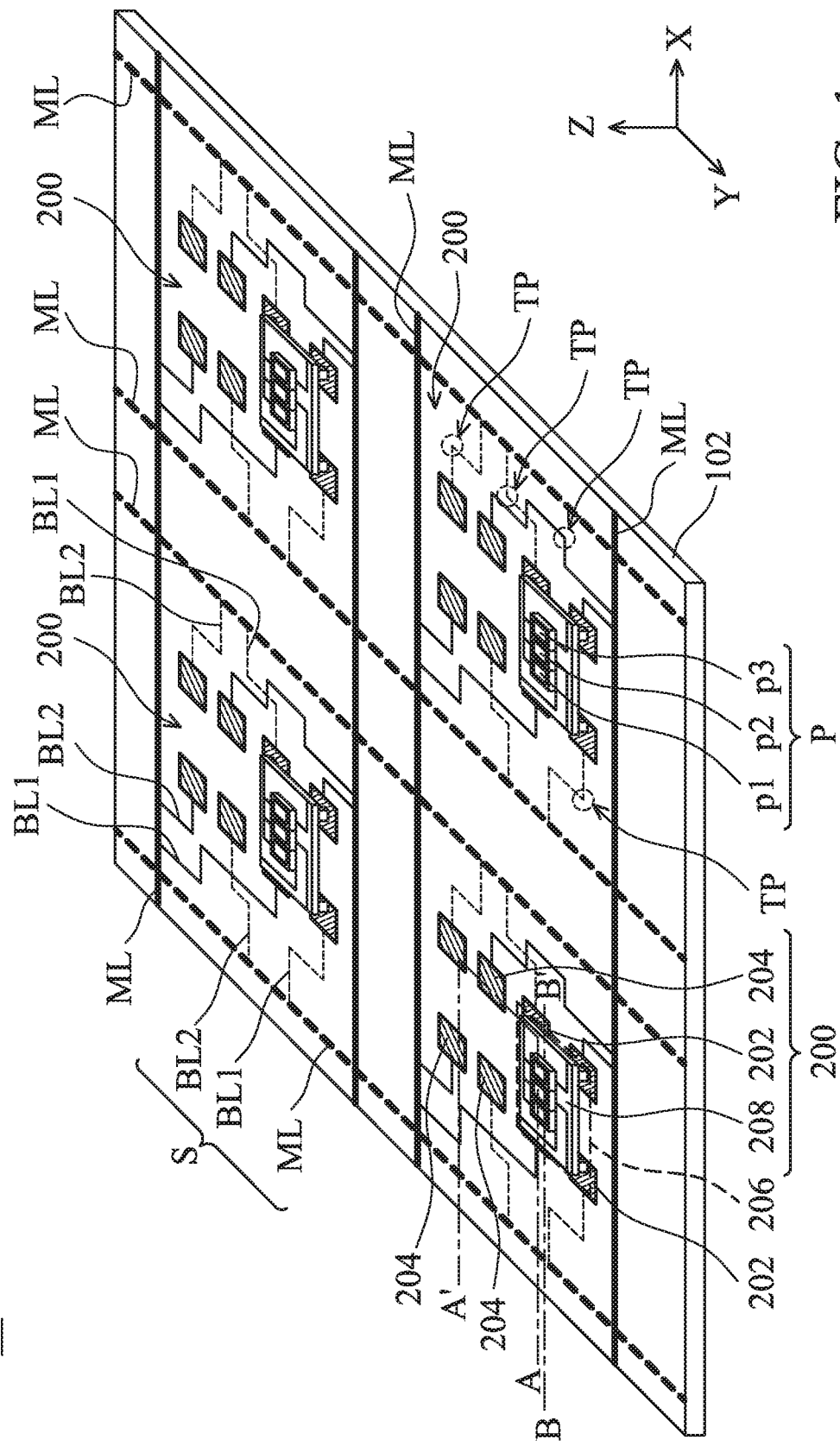
FIG. 1 is a diagram of a portion of the display device in accordance with some embodiments of the present disclosure.

The display device of the present disclosure and the manufacturing method thereof are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the concept of the present disclosure may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first layer disposed on/over a second layer", may indicate the direct contact of the first layer and the second layer, or it may indicate a non-contact state with one or more intermediate layers between the first layer and the second layer. In the above situation, the first layer may not be in direct contact with the second layer.

It should be noted that the elements or devices in the drawings of the present disclosure may be present in any form or configuration known to those with ordinary skill in the art. In addition, the expressions "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In addition, the term "longitudinal direction" is defined as the direction along or parallel to the long axis of an object. The long axis is defined as a line extending through the center of an object lengthwise. For an elongated or oblong object, the long axis corresponds most nearly to its greatest dimension lengthwise. For an object that does not have a definite long axis, the long axis is referred to the long axis of a minimum rectangle that can encircle the object.

The terms "main pad" and "redundant pad" used in the present disclosure may be interchangeable according to the relative positions and different statuses of a light-emitting device in a display unit. In some cases, "main pad" is defined as the pad that has a larger overlapping area in the Z direction with connecting posts (which will be described in detail in FIG. 11A) of a functional light-emitting device. On the other hand, "redundant pad" is defined as the pad that has a smaller overlapping area in the Z direction with connecting posts of a functional light-emitting device. In some embodiments, the overlapping area between the redundant pad and the connecting post may be zero, i.e. the redundant pad and the connecting post do not overlap.

In addition, the term "functional light-emitting device" means that a light-emitting device may produce the images having different gray scales according to the different received signals. On the other hand, the term "dysfunctional light-emitting device" means that a light-emitting device may flicker or constantly emit light when an off signal is given. Alternatively, the term "dysfunctional light-emitting device" may refer to a light-emitting device that may have the brightness that is different from the surrounding light-emitting devices.

The disclosure may be used in an electronic device. The electronic device may include, but is not limited to, a display device, touch display device or a sensing device. For example, the electronic devices may be arranged in juxtaposition to form a tiled electronic device in accordance with some embodiments. The display device may include, but is not limited to, an OLED display, a QLED display, a LED display (e.g. micro LED or mini LED) or a flexible display.

In accordance with some embodiments of the present disclosure, a plurality of main pads and a plurality of redundant pads are disposed on the substrate (e.g., the destination substrate) of the display device. The redundant pads may serve as spare pads in case the electrical connection between the main pad and an electronic component such as a light-emitting device is dysfunctional or damaged. With such a configuration, the repair and replacement of the damaged electronic device may become effective. In addition, in accordance with some embodiments of the present disclosure, the dies that correspond to the subpixels of the display device may be packaged together on an intermediate substrate before they are transferred to the destination substrate so that the time required for the transfer may be reduced.

FIG. 1 is a diagram of a portion of the display device 10 in accordance with some embodiments of the present disclosure. It should be understood that additional features may be added to the display device in accordance with some embodiments of the present disclosure. Some of the features described below may be replaced or eliminated in accordance with some embodiments of the present disclosure. In addition, some of the features may be simplified or omitted for clarity.

Referring to FIG. 1, the display device 10 includes a first substrate 102 and a plurality of signal lines S disposed on the first substrate 102. In addition, the display device 10 includes a plurality of display units 200 disposed on the first substrate 102. The first substrate 102 may be a destination substrate (such as an array substrate) of the display device 10. The signal lines may provide signals to control the display unit 200. The display unit 200 also includes a driving element (not illustrated) that is electrically connected to the signal lines. In some embodiments, the driving element may include an active driving element such as a thin-film transistor (TFT). In some other embodiments, the driving elements may include a passive driving element. For example, the driving elements may be controlled by an IC or a microchip through a pad.

In some embodiments, the material of the first substrate 102 may include, but is not limited to, glass, quartz, sapphire, polycarbonate (PC), polyimide (PI), polyethylene terephthalate (PET), rubbers, glass fibers, other polymer materials, any other suitable substrate material, or a combination thereof. In some embodiments, the first substrate 102 may be made of a metal-glass fiber composite plate, a metal-ceramic composite plate, a printed circuit board, or any other suitable material, but it is not limited thereto.

The signal lines S may include a plurality of main lines ML in accordance with some embodiments. It should be understood that the main lines ML represented by the solid lines and the dotted lines are disposed on different horizontal levels (different layers in a structure). In some embodiments, the main lines ML may be the data line or scan line on the first substrate 102. Specifically, the main lines ML may provide different types of signals for the display unit 200.

For example, in some embodiments, three of the main lines ML may provide the signals for the p-electrodes of the display element (e.g., the light-emitting device 206 described in the following context) in the display unit 200 and one of the main lines ML may provide the signals for the n-electrode of the display element. In some other embodiments, three of the main lines ML may provide the signals for the n-electrodes of the display element and one of the main lines ML may provide the signals for the p-electrode of the display element. In some embodiments, one of the main lines ML may provide the signals to control a common electrode. In addition, the signal lines may further include first branch lines BL1 and second branch lines BL2 in accordance with some embodiments. In some embodiments, the first branch line BL1 and the second branch line BL2 are each electrically connected to the main line ML. In other words, each main line ML is electrically connected to at least a first branch line BL1 and at least a second branch line BL2 in accordance with some embodiments.

In some embodiments, the main lines ML, the first branch line BL1 and the second branch line BL2 each may be made of a conductive material. The conductive material used in forming the main lines ML, the first branch line BL1 and the second branch line BL2 may include, but is not limited to, copper, aluminum, tungsten, titanium, gold, silver, molybdenum, copper alloys, aluminum alloys, tungsten alloys, titanium alloys, gold alloys, silver alloys, molybdenum alloys, any other suitable conductive materials, or a combination thereof.

In addition, the display unit 200 may include a plurality of main pads 202, a plurality of redundant pads 204, and a light-emitting device 206 electrically connected to the main pads 202. The main pads 202 may provide electrical connection between the signal lines (e.g., the main lines or the branch lines) and the light-emitting device 206. The redundant pads 204 may serve as spare pads in case the electrical connection between the signal lines (e.g., the main line ML or the first branch line BL1) and the main pad 202, or between the main pad 202 and the light-emitting device 206 is dysfunctional or damaged. In some embodiments, the main pad 202 is electrically connected to the first branch line BL1, and the redundant pad 204 is electrically connected to the second branch line BL2. More specifically, the main pad 202 is electrically connected to the main line ML via the first branch line BL1, and the redundant pad 204 is electrically connected to the main line ML via the second branch line BL2. In some embodiments, more than one first branch lines BL1 may be disposed between the main pads 202 and the main line ML. In some embodiments, more than one second branch lines BL2 may be disposed between the redundant pad 204 and the main line ML.

As shown in FIG. 1, since the first branch line BL1 and the second branch line BL2 are connected to the main pad 202 and the redundant pad 204, which are disposed in different positions, the length of the first branch line BL1 may be different than the length of the second branch line BL2 in accordance with some embodiments. In some embodiments, the first branch line BL1 and the second branch line BL2 each may include one or more turning portions TP. In addition, the width of the main line ML may be greater than the width of the first branch line BL1 and the second branch line BL2 in accordance with some embodiments. With such a configuration, the quality of the signals transmitted by the signal lines will be more stable.

In some embodiments, the main pad 202 and the redundant pad 204 each may be made of a metallic conductive material. In some embodiments, the metallic conductive material used in forming the main pad 202 and the redundant pad 204 may include, but is not limited to, copper, aluminum, molybdenum, tungsten, gold, chromium, nickel, copper alloys, aluminum alloys, molybdenum alloys, tungsten alloys, gold alloys, chromium alloys, nickel alloys, any other suitable metallic materials, or a combination thereof. In some other embodiments, the main pad 202 and the redundant pad 204 each may be made of transparent conductive materials. In some embodiments, the transparent conductive materials for forming the main pad 202 and the redundant pad 204 may include, but is not limited to, indium tin oxide (ITO), tin oxide (SnO), indium zinc oxide (IZO), indium gallium zinc oxide (IGZO), indium tin zinc oxide (ITZO), any other suitable transparent conductive materials, or a combination thereof. In addition, the main pad 202 and the redundant pad 204 may be made of different materials in accordance with some embodiments. In some other embodiments, the main pad 202 and the redundant pad 204 may be made of the same material.

In some embodiments, the main pad 202 and the redundant pad 204 may be formed by using chemical vapor deposition, physical vapor deposition, electroplating process, electroless plating process, any other suitable processes, or a combination thereof. The chemical vapor deposition may include, but is not limited to, low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), or any other suitable method. The physical vapor deposition may include, but is not limited to, sputtering, evaporation, pulsed laser deposition (PLD), or any other suitable method.

In addition, the light-emitting device 206 may include an inorganic light-emitting diode device (e.g., dies of light-emitting diode) in accordance with some embodiments. As shown in FIG. 1, the light-emitting device 206 has three LED dies. In some embodiments, the inorganic light-emitting diode device may be a mini LED device or a micro LED device. For example, the cross-sectional area of the mini LED dies may have a length ranging from about 100 μm to about 200 μm and may have a width ranging from about 100 μm to about 200 μm. In some embodiments, the mini LED dies may have a size ranging from about 100 μm×100 μm×100 μm to about 200 μm×200 μm×200 μm. For example, the cross-sectional area of the micro LED dies may have a length ranging from about 1 μm to about 100 μm and may have a width ranging from about 1 μm to about 100 μm. In some embodiments, the micro LED dies may have a size ranging from about 1 μm×1 μm×1 μm to about 100 μm×100 μm×100 μm.

In some embodiments, the light-emitting device 206 may be formed of multiple flip-chip dies. In some embodiments, these flip-chip dies may be packaged together on an intermediate substrate 208 before they are transferred to the first substrate 102. For example, three flip-chip dies may be packaged on an intermediate substrate 208 first and then are together transferred to the first substrate 102 in accordance with some embodiments.

In some embodiments, the light-emitting device 206 may correspond to a pixel region P in the display device 10. The pixel region P of the light-emitting device 206 may include one or more subpixels for emitting the lights of suitable colors. For example, in some embodiments, the pixel region P of the light-emitting device 206 may include a subpixel p1, a subpixel p2 and a subpixel p3 for emitting red light, green light and blue light respectively. In some embodiments, the subpixel p1, subpixel p2 and subpixel p3 share a common p-electrode and the p-electrode is electrically connected to one main pad 202 (i.e. one main line ML), while the n-electrodes of the subpixel p1, subpixel p2 and subpixel p3 are electrically connected to three different main pads 202 (i.e. three different main lines ML). In some embodiments, the subpixel p1, subpixel p2 and subpixel p3 share a common n-electrode and the n-electrode is electrically connected to one main pad 202 (i.e. one main line ML), while the p-electrodes of the subpixel p1, subpixel p2 and subpixel p3 are electrically connected to three different main pads 202 (i.e. three different main lines ML). However, it should be understood that the light-emitting device 206 may have another suitable amount of subpixels and another suitable circuit arrangement according to need in some other embodiments. In some embodiment, the region P may be defined as a region that is the same as the display unit 200.

Figure 2A:
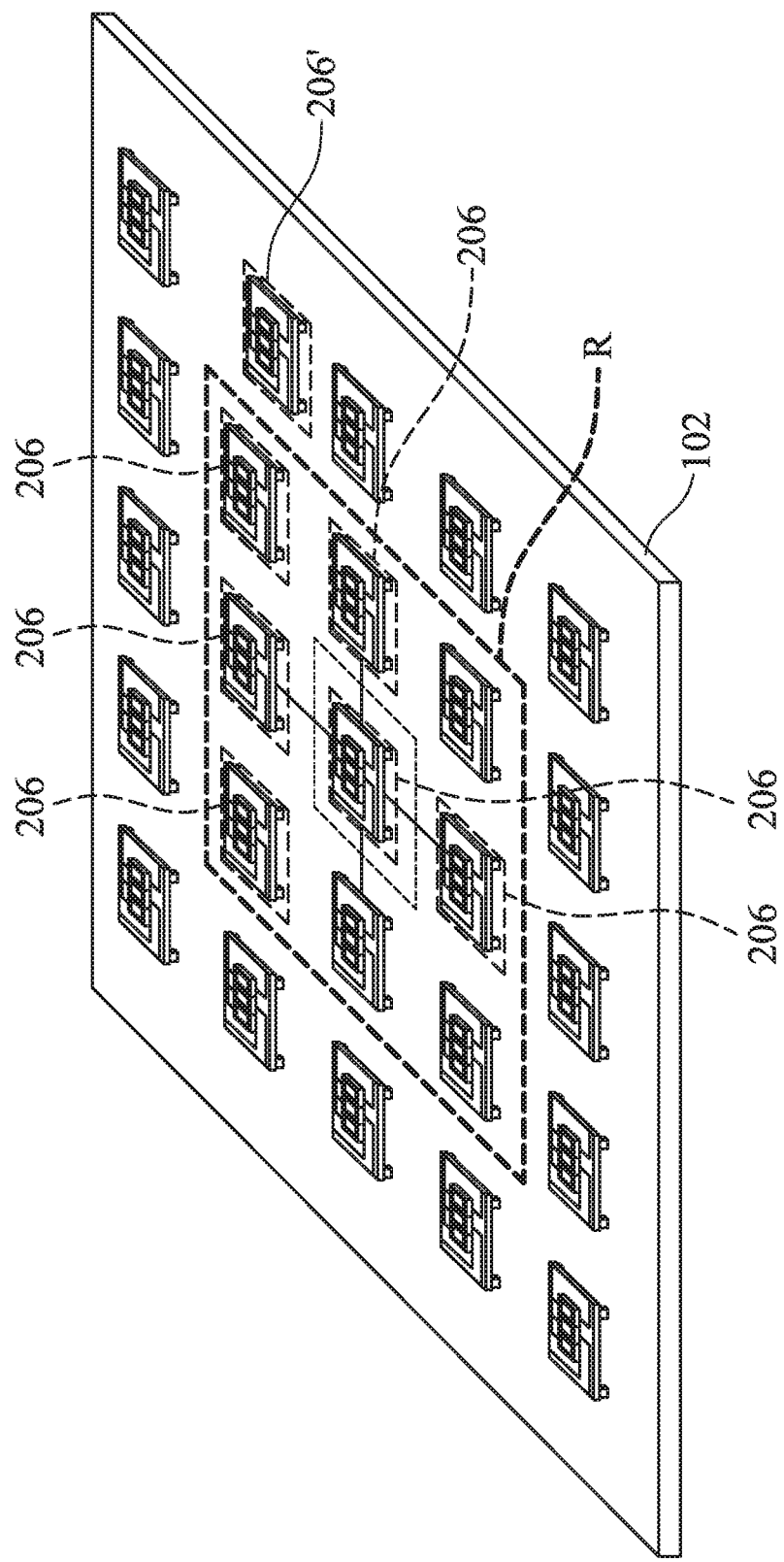
FIG. 2A is a diagram of a portion of the display device in accordance with some embodiments of the present disclosure.
Figure 2B:
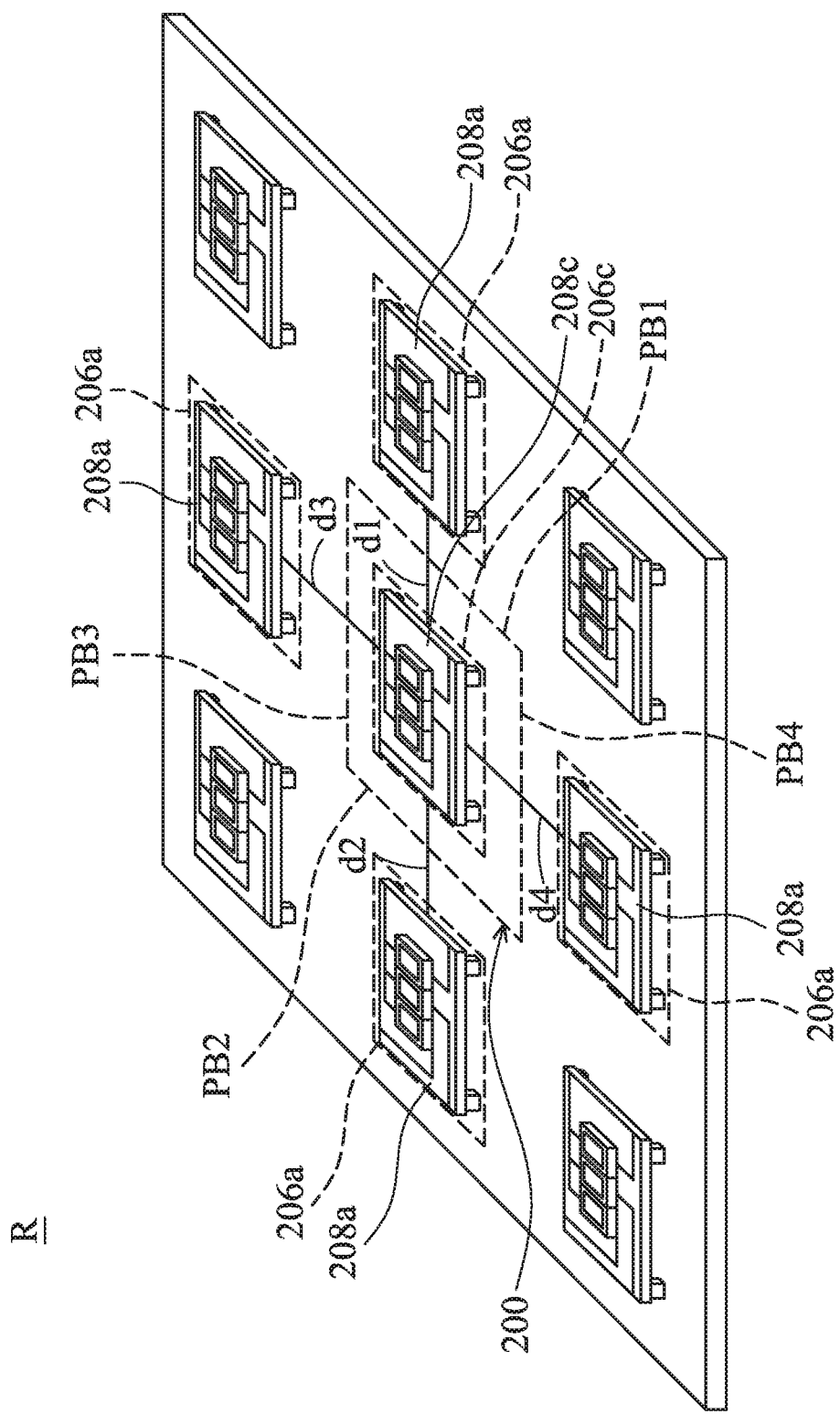
FIG. 2B illustrates a partial enlarged view of the region R in FIG. 2A.
Figure 3:
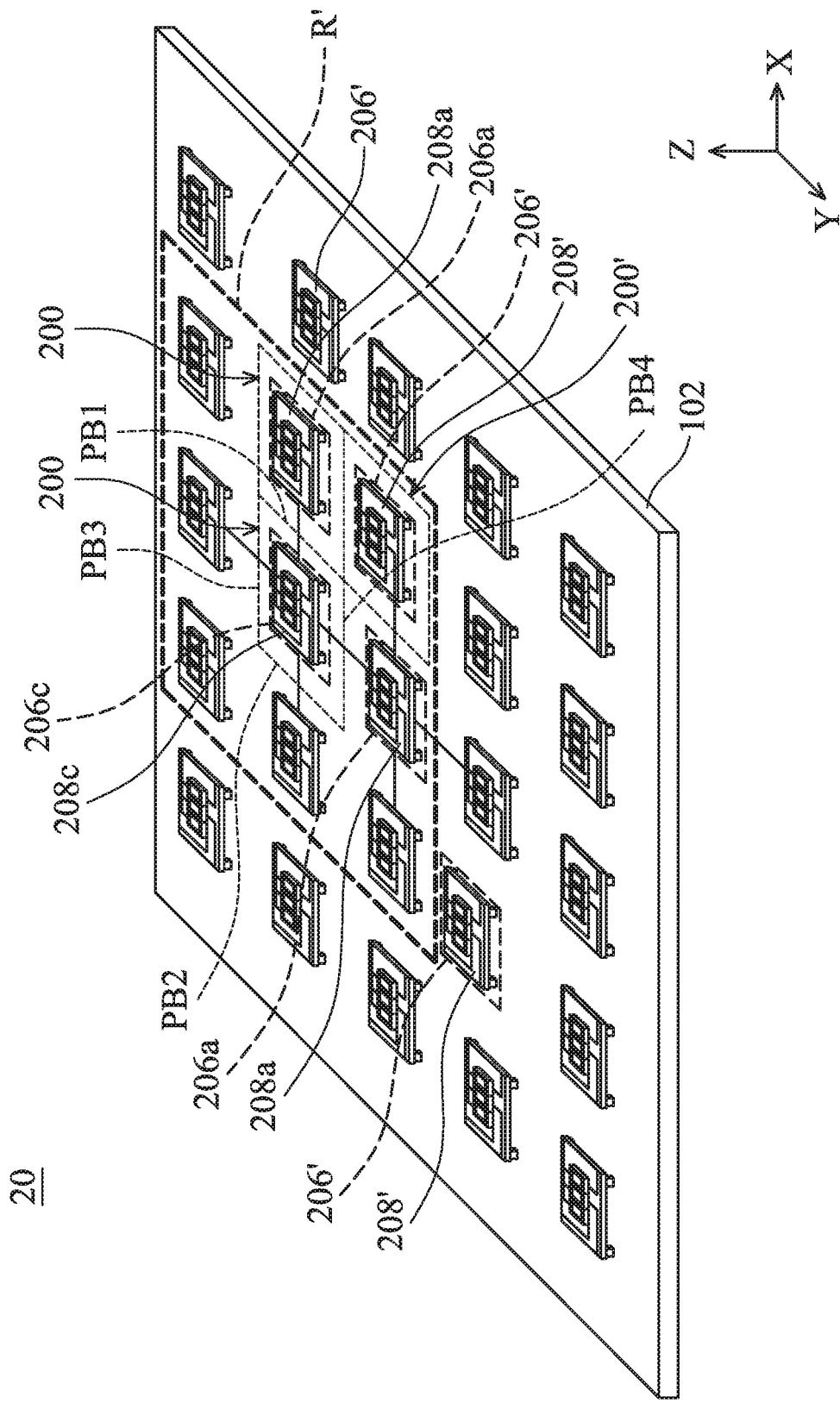
FIG. 3 is a diagram of a portion of the display device in accordance with some embodiments of the present disclosure.

It should be understood that the display unit 200 described in the present disclosure may refer to the following definitions as illustrated in FIGS. 2A-2B and FIG. 3 and so on in various circumstances. FIG. 2A illustrates a portion of the display device 10 in accordance with some embodiments of the present disclosure. It should be understood that several elements (e.g., the signal lines S, the main pads 202 the redundant pads and so on) are omitted in the figure for clarity. As shown in FIG. 2A, the display device 10 includes a plurality of light-emitting devices 206. Some of the light-emitting devices 206 are non-dislocated and some of the light-emitting devices 206' are dislocated. In this embodiment, an area having about 5×5 of the light-emitting devices 206, the light-emitting devices 206' or a combination of the light-emitting devices 206 and the light-emitting devices 206' (about twenty-five light-emitting devices) is randomly selected, and then a region R including 3×3 of the light-emitting devices 206 (nine light-emitting devices) that are all non-dislocated is selected.

Figure 11A:
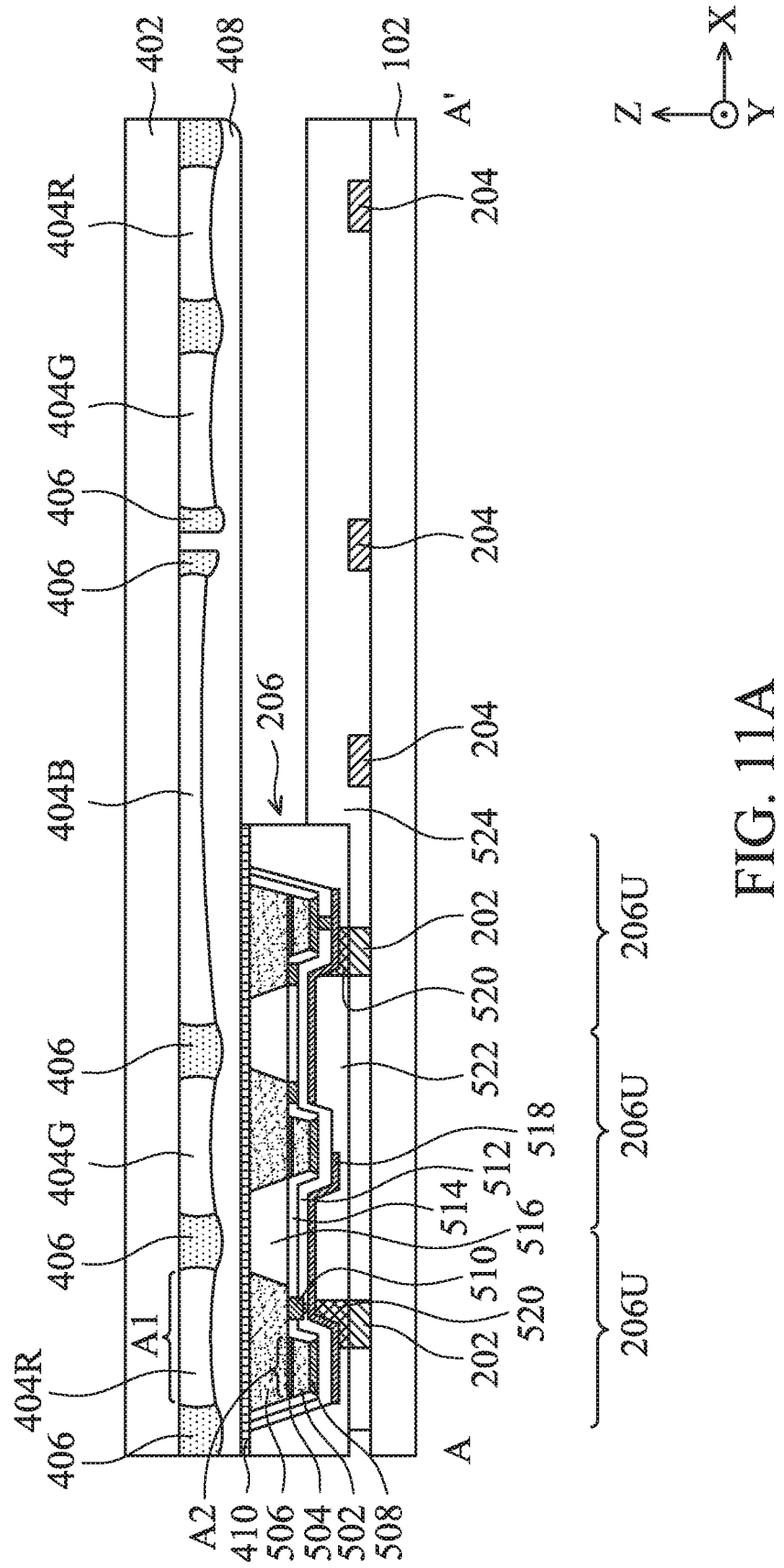
FIG. 11A is a cross-sectional diagram of the display device along the line segment A-A' in FIG. 1.

Further referring FIG. 2B, FIG. 2B illustrates a partial enlarged view of the region R in FIG. 2A. In order to clearly illustrate the relative positions of the light-emitting devices 206, the light-emitting device 206 disposed at the center of the region R is indicated as the light-emitting device 206c, and the light-emitting device 206 disposed next to the light-emitting device 206c is indicated as the light-emitting device 206a in FIG. 2B. Specifically, the minimum distance between the light-emitting device 206c and each of the light-emitting device 206a is defined as a first distance d1, a second distance d2, a third distance d3 and a fourth distance d4. For example, the first distance d1, the second distance d2, the third distance d3 and the fourth distance d4 may be defined as the minimum distances between the intermediate substrate 208c of the light-emitting device 206c and the intermediate substrate 208a of the four adjacent light-emitting devices 206a respectively. The first distance d1, the second distance d2, the third distance d3 and the fourth distance d4 may be the same as one another or different from one another. In addition, the first distance d1, the second distance d2, the third distance d3 and the fourth distance d4 include a first perpendicular bisector PB1, a second perpendicular bisector PB2, a third perpendicular bisector PB3 and a fourth perpendicular bisector PB4 respectively. In some embodiment, the first distance d1, the second distance d2, the third distance d3 and the fourth distance d4 may be defined as the minimum distances between an encapsulating layer (e.g., as shown in FIG. 11A) of the light-emitting device 206c and an encapsulating layer of the light-emitting device 206a.

Referring to FIG. 2B. In the embodiments where most of the light-emitting devices 206 are non-dislocated, the display unit 200 is defined as an area encircled by the perpendicular bisectors of the minimum distances between the light-emitting device 206c that is disposed at the center of the region R and the four adjacent light-emitting devices 206a. For example, in this embodiment, the first perpendicular bisector PB1 of the first distance d1, the second perpendicular bisector PB2 of the second distance d2, the third perpendicular bisector PB3 of the third distance d3 and the fourth perpendicular bisector PB4 of the fourth distance d4 define the display unit 200.

Next, FIG. 3 illustrates a portion of the display device 20 in accordance with some embodiments of the present disclosure. It should be noted that the same or similar elements in above and below contexts are represented by the same or similar reference numerals. The materials, manufacturing methods and functions of these elements are the same or similar to those described above, and thus will not be repeated herein. As shown in FIG. 3, the display device 20 includes a plurality of light-emitting devices 206. Some of the light-emitting devices 206 are non-dislocated and some of the light-emitting devices 206 are dislocated (which are indicated as dislocated light-emitting devices 206'). In this embodiment, an area having about 5×5 of the light-emitting devices 206 is randomly selected, and then a region R' including 3×3 of the light-emitting devices 206 that are mostly non-dislocated is selected. However, in this embodiment, the region R' still includes some dislocated light-emitting devices 206'.

In this embodiment, the display unit 200 of a light-emitting device 206 that is non-dislocated in the region R' is defined first. For example, the light-emitting device 206c is defined in the similar way as described in FIG. 2B. The light-emitting device 206c is disposed next to the light-emitting devices 206a that are non-dislocated. Thereafter, the area of the display unit 200 defined by the non-dislocated light-emitting device 206c may shift to the adjacent light-emitting devices 206, including the non-dislocated light-emitting device 206a and the dislocated light-emitting devices 206', to define their display units 200.

In the embodiments where some of the light-emitting devices 206 are dislocated and some of the light-emitting devices 206 are non-dislocated, the display unit 200 for a non-dislocated light-emitting device 206 is defined first. Specifically, the display unit 200 is defined as an area encircled by the perpendicular bisectors of the segments that are indicated as the minimum distances between the non-dislocated light-emitting device 206c and the four adjacent non-dislocated light-emitting devices 206a. The area of the above display unit 200 may then shift to the dislocated light-emitting devices 206' that are disposed on the dislocated main pads 202' to define a display unit 200' of the dislocated light-emitting devices 206'. The area of the display unit 200' does not overlap that of the first-defined display unit 200. For example, the display unit 200 may shift along the X direction or the Y direction in the embodiment shown in FIG. 3.

In addition, the display unit 200 may refer to an area encircled by the main lines ML (as shown in FIG. 1) in accordance with some embodiments of the present disclosure. Specifically, the display unit 200 is defined as the area encircled by the four main lines ML electrically connected to one light-emitting device 206. For example, the four main lines may include the a main line ML that provides the signals for a common electrode of the light-emitting device 206 and three main lines ML that provide the signals for the other three electrodes of the light-emitting device 206. In other words, the four main lines may be the main lines that provide the signals for one p-electrode and three n-electrodes, or one n-electrode and three p-electrodes of one light-emitting device 206.

Figure 4:
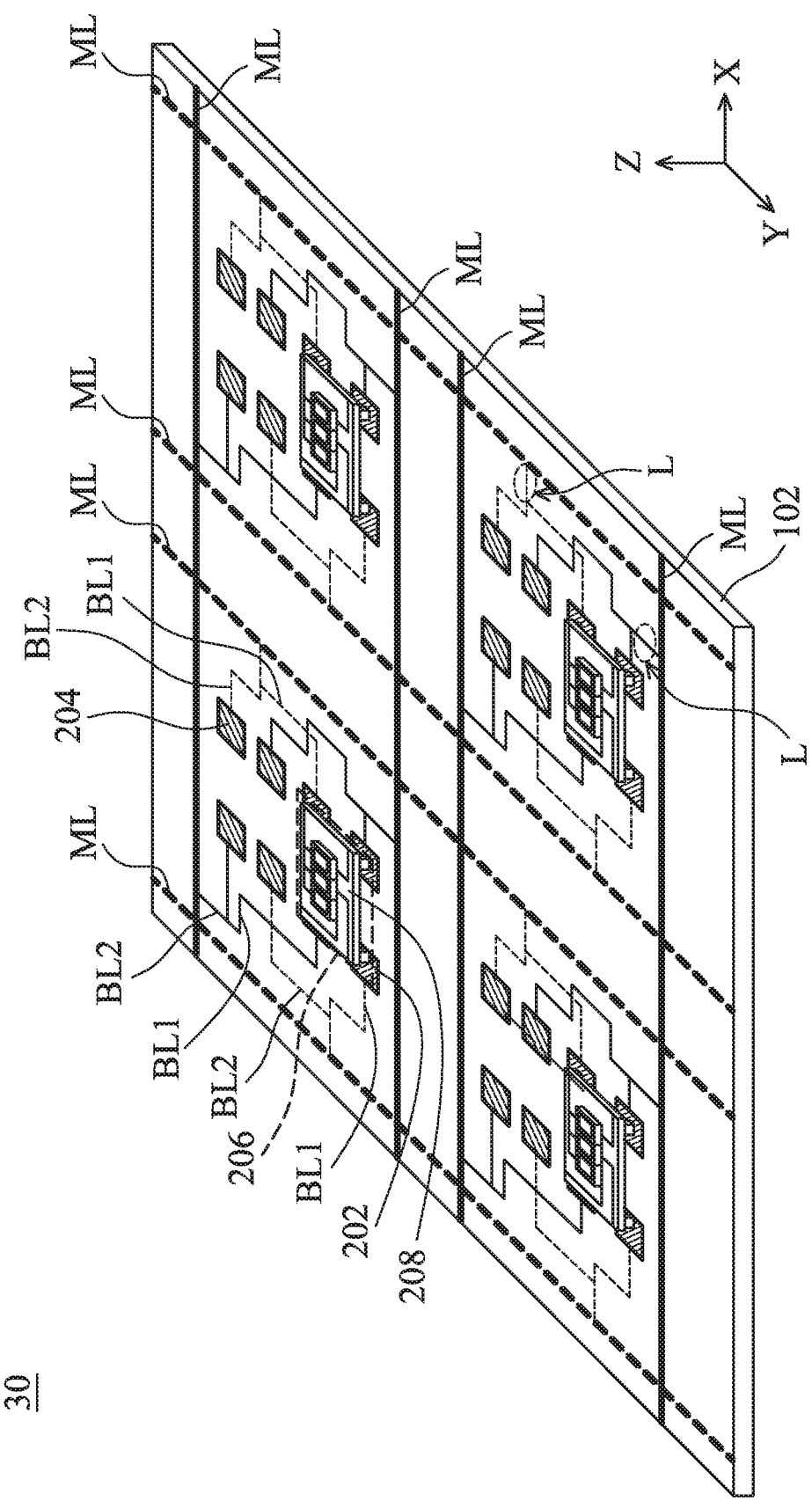
FIG. 4 is a diagram of a portion of the display device in accordance with some embodiments of the present disclosure.

Next, FIG. 4 is a diagram of a portion of the display device 30 in accordance with some embodiments of the present disclosure. The difference between the display device 30 in FIG. 4 and the display device 10 in FIG. 1 is that the first branch line BL1 partially overlaps the second branch line BL2 in the embodiment shown in FIG. 4. Specifically, in this embodiment, the first branch line BL1 and the second branch line BL2 may be disposed on different layers (e.g., corresponding to different metal layers or fabricated in the different processes), and the first branch line BL1 overlaps the second branch line BL2 at a region L near the position where the first branch line BL1 contacts the main line ML. The first branch line BL1 and the second branch line BL2 may overlap with each other and then separate to make contact with the main pad 202 and the redundant pad 204 respectively. In other embodiments where the first branch line BL1 and the second branch line BL2 may be disposed on the same layer (e.g., corresponding to the same metal layer or fabricated in the same process), the first branch line BL1 and the second branch line BL2 may have the same conjunction near the position where the first branch line BL1 contacts the main line ML. In other words, the first branch line BL1 and the second branch line BL2 may share the same circuit in the beginning and then separate into two circuits to contact with the main pad 202 and the redundant pad 204 respectively.

Figure 5:
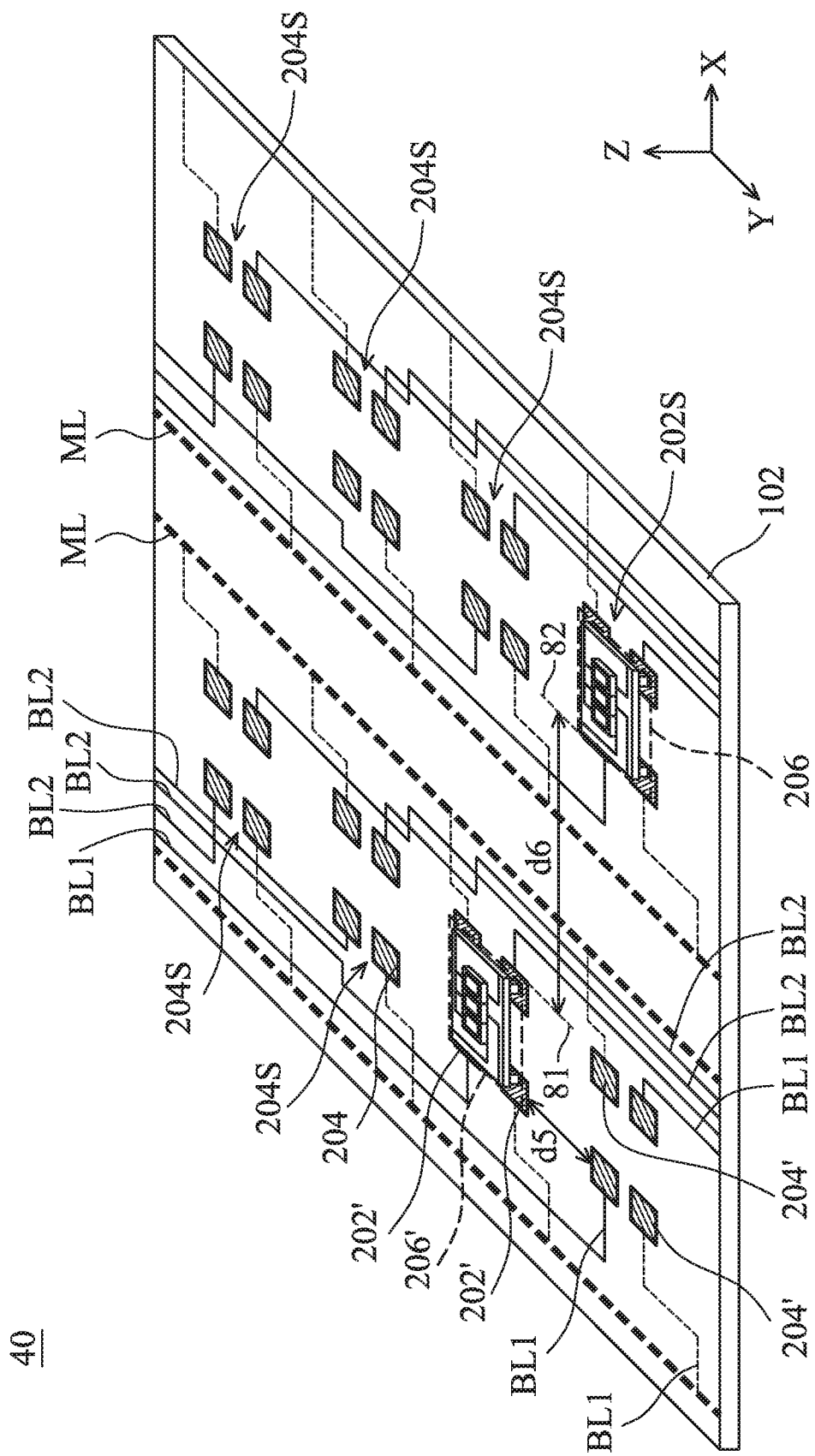
FIG. 5 is a diagram of a portion of the display device in accordance with some embodiments of the present disclosure.

Next, FIG. 5 illustrates a portion of the display device 40 in accordance with some embodiments of the present disclosure. The difference between the display device 40 in FIG. 5 and the display device 10 in FIG. 1 is that the number of main pads 202 is less than the number of redundant pads 204 in the display unit 200 in the embodiment shown in FIG. 5. As shown in FIG. 5, the display device 40 may include more than one set of redundant pads 204S (e.g., including four redundant pads 204) in case the electrical connection between the redundant pads 204 and the signal lines S or between the redundant pads 204 and the light-emitting device 206 is also damaged. For example, the display device 40 includes three sets of redundant pads 204S. In some other embodiments, the display device 40 may include 2 sets, 3 sets, 4 sets, or other suitable number sets of redundant pads 204S according to need.

In this embodiment, the display device 40 includes a non-dislocated light-emitting device 206 that is disposed on the original main pads 202 and a dislocated light-emitting device 206' that is disposed on the dislocated main pads 202' (i.e. the original redundant pads 204). In this embodiment, a light-emitting device 206 was once disposed on the redundant pads 204' as shown in FIG. 5, but was removed and replaced with a new light-emitting device (i.e. the dislocated light-emitting device 206') disposed on the dislocated main pads 202'. In some embodiments, the light-emitting device 206 may be removed due to poor electrical connection between the light-emitting device 206 and the main pads 202 or dysfunction of the light-emitting device 206.

Since the display device may include the dislocated light-emitting device 206' in accordance with some embodiments, the position of the pixel region P of the display device may be altered so that the pitches among the pixel region P may be not uniform. In some cases, the dislocation of pixels will result in abnormal displays. As shown in FIG. 5, in some embodiments, the minimum distance between a main pad 202' and a redundant pad 204' is defined as d5, and the minimum distance between a main pad 202' in one display unit 200 and a main pad 202 in another one display unit 200 is defined as d6. In some embodiments, the distance d5 is less than half the distance d6. In some embodiments, the minimum distance between a main pad 202' in a display unit 206' and a main pad 202 in another display unit 206 is defined as a minimum perpendicular distance between a main pad 202' in a display unit 206' and a main pad 202 in another display unit 206. As shown in FIG. 5, the main pad 202' has an outer extending line 81 that is close to the display unit 206. The main pad 202 has an outer extending line 82 that is close to the display unit 206'. The minimum distance or the minimum perpendicular distance described above may be defined as a distance between the outer extending line 81 and the outer extending line 82. It should be noted that the distance between the main pad 202 and the redundant pad 204, and the distance between the main pads 202 should be well controlled so that the image quality provided by the display device can be maintained even if the light-emitting device is dislocated.

Figure 6A:
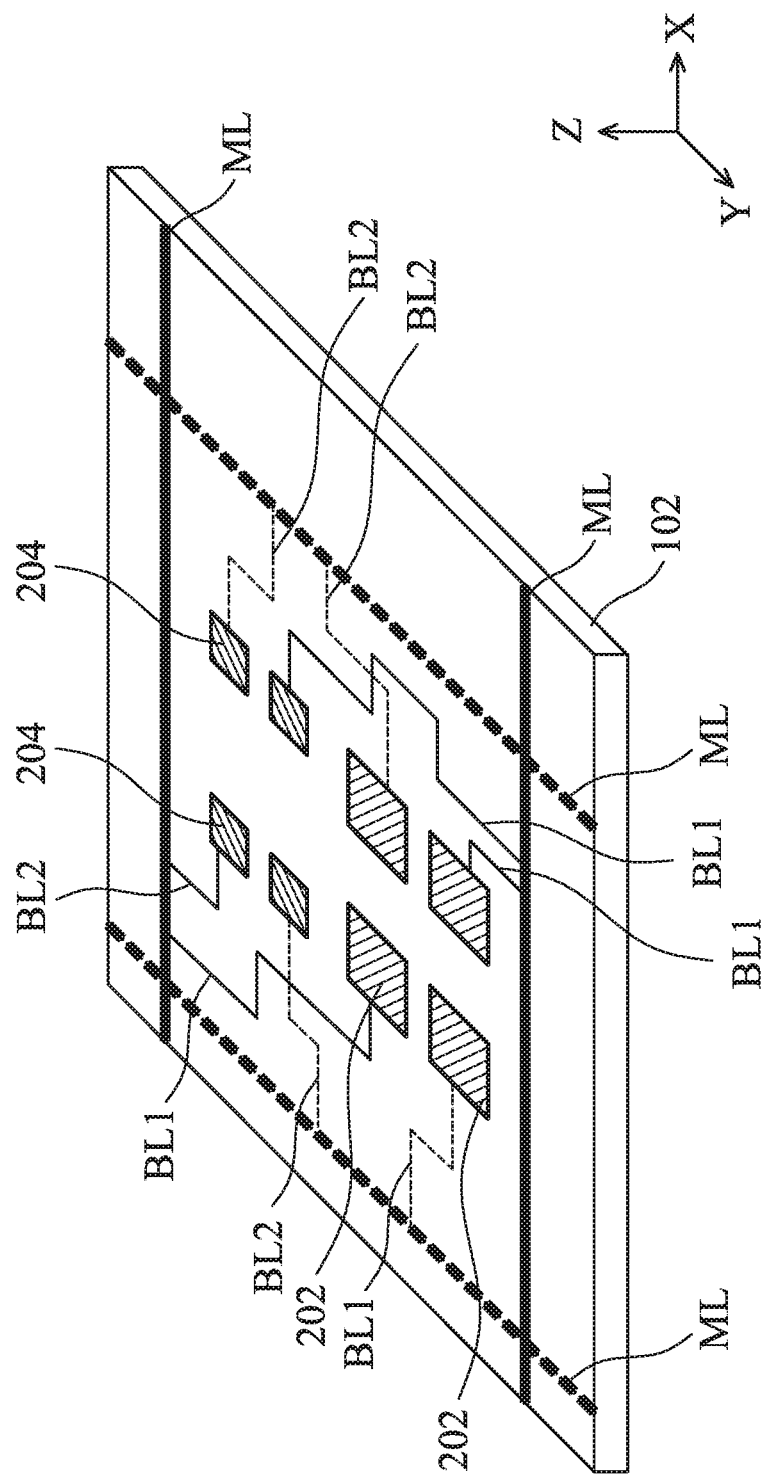
FIG. 6A is a diagram of a portion of the display device in accordance with some embodiments of the present disclosure.

Next, FIG. 6A illustrates a portion of the display device 50 in accordance with some embodiments of the present disclosure. As shown in FIG. 6A, the area of the main pad 202 may be different from the area of the redundant pad 204 in accordance with some embodiments. However, the area of the main pad 202 may be the same as that of the redundant pad 204 in accordance with some other embodiments. In some embodiments, the area of the main pad 202 may be greater than the area of the redundant pad 204. More specifically, FIG. 6B is a diagram of the top view of the display device 50. It should be noted that most of the elements are omitted for clarity, and the connecting posts 520 (which will be described in detail in FIG. 11A) of the light-emitting device 206 is illustrated in FIG. 6B to explain the relative positions of the main pads 202 and the redundant pads 204. As shown in FIG. 6B, the area 202A of the main pad 202 may be greater than the area 204A of the redundant pad 204 in accordance with some embodiments. However, both the areas of the main pad 202 and the redundant pad 204 should be large enough to encompass the connecting posts 520. In some embodiments, the main pads 202 and the redundant pads 204 have overlapping areas if they are piled together along the Z direction, and the connecting posts 520 can be mounted on these overlapping areas.

Figure 7B:
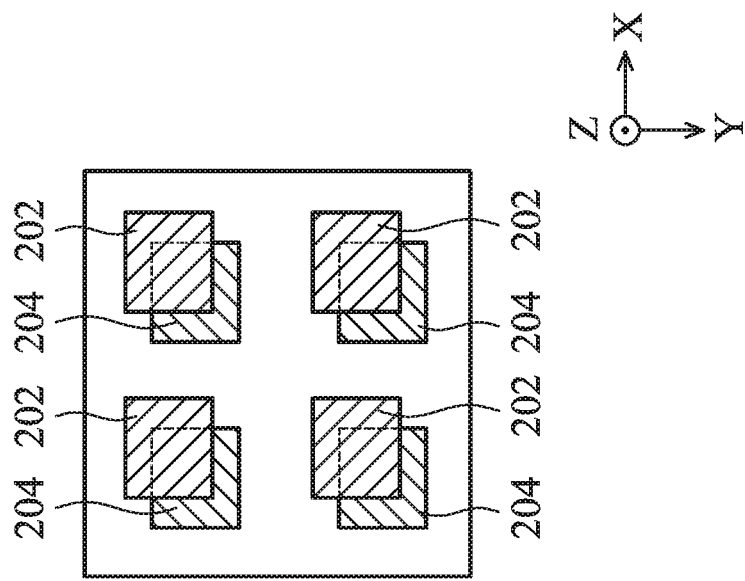
FIG. 7B is a top-view diagram of the display device in FIG. 7A.
Figure 7A:
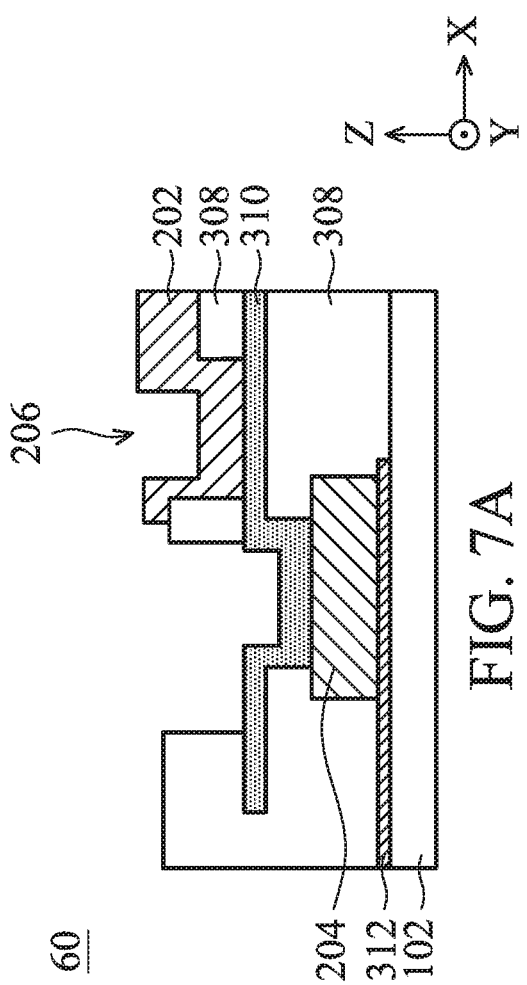
FIG. 7A is a cross-sectional diagram of a portion of the display device in accordance with some embodiments of the present disclosure.

Next, FIG. 7A illustrates a cross-sectional diagram of a portion of the display device 60 in accordance with some embodiments of the present disclosure. The display device 60 includes a metal line 312 disposed on the first substrate 102, and a passivation layer 308 disposed on the first substrate 102 and the metal line 312. The metal line 312 may be one of the signal lines of the display device 60. In this embodiment, the redundant pad 204 is disposed on the metal line 312. The redundant pad 204 is electrically connected to the metal line 312. The display device 60 further includes a connecting layer 310 that is in electrical connection with the redundant pad 204 and the main pad 202. The connecting layer 310 is disposed on the redundant pad 204 and the passivation layer 308. In addition, the connecting layer 310 is disposed between the redundant pad 204 and the main pad 202. In this embodiment, the light-emitting device 206 may be disposed on the main pad 202. In some embodiments, the light-emitting device 206 may be disposed in the recess formed by the main pad 202. In this embodiment, the main pad 202 is disposed on the upper layer of the display device 60 while the redundant pad 204 is disposed on the lower layer. However, in some other embodiments, the redundant pad 204 may be disposed on the upper layer while the main pad 202 may be disposed on the lower layer.

As shown in FIG. 7A, the main pad 202 and the redundant pad 204 may be disposed on different layers in the structure of the display device 60 in accordance with some embodiments. In other words, the main pad 202 and the redundant pad 204 may be disposed on different horizontal planes (e.g., the different X-Y planes in the Z direction shown in FIG. 7A). With such a configuration, more space may be saved in the display unit. In addition, FIG. 7B illustrates a top-view diagram of the display device 60 in FIG. 7A. It should be understood that the elements other than the main pads 202 and the redundant pads 204 are omitted in FIG. 7B. As shown in FIG. 7B, the main pad 202 may partially overlap the redundant pad 204 along the Z direction in accordance with some embodiments. In some embodiments, the Z direction may refer to the normal direction of the first substrate 102.

Figure 7C:
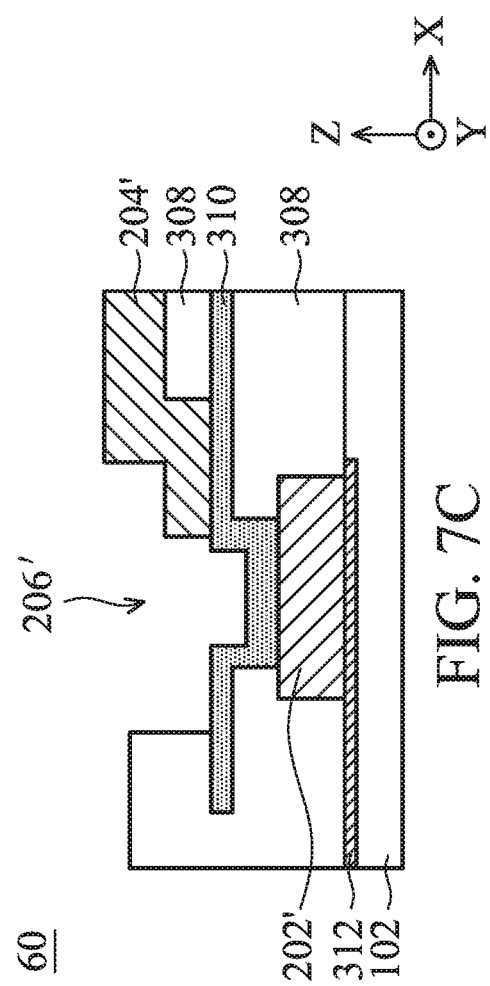
FIG. 7C is a cross-sectional diagram of a portion of the display device in accordance with some other embodiments of the present disclosure.

Next, FIG. 7C illustrates a cross-sectional diagram of a portion of the display device 60 in accordance with some other embodiments of the present disclosure. In some embodiments, the light-emitting device 206 disposed on the main pad 202 shown in FIG. 7A is removed and a new one is disposed on the original position of the redundant pad 204, which serves as the new main pad. As shown in FIG. 7C, the dislocated light-emitting device 206' is disposed on the newly-defined main pad, i.e. the dislocated main pads 202'. In some embodiments, the dislocated light-emitting device 206' may be disposed in the recess formed by the dislocated main pads 202'. In some embodiments, while the original light-emitting device 206 is removed, the original main pad 202 may be damaged. However, since the original redundant pad 204 (i.e. the dislocated main pads 202') remains intact, it may serve as the new main pad for electrical connection.

Figure 8:
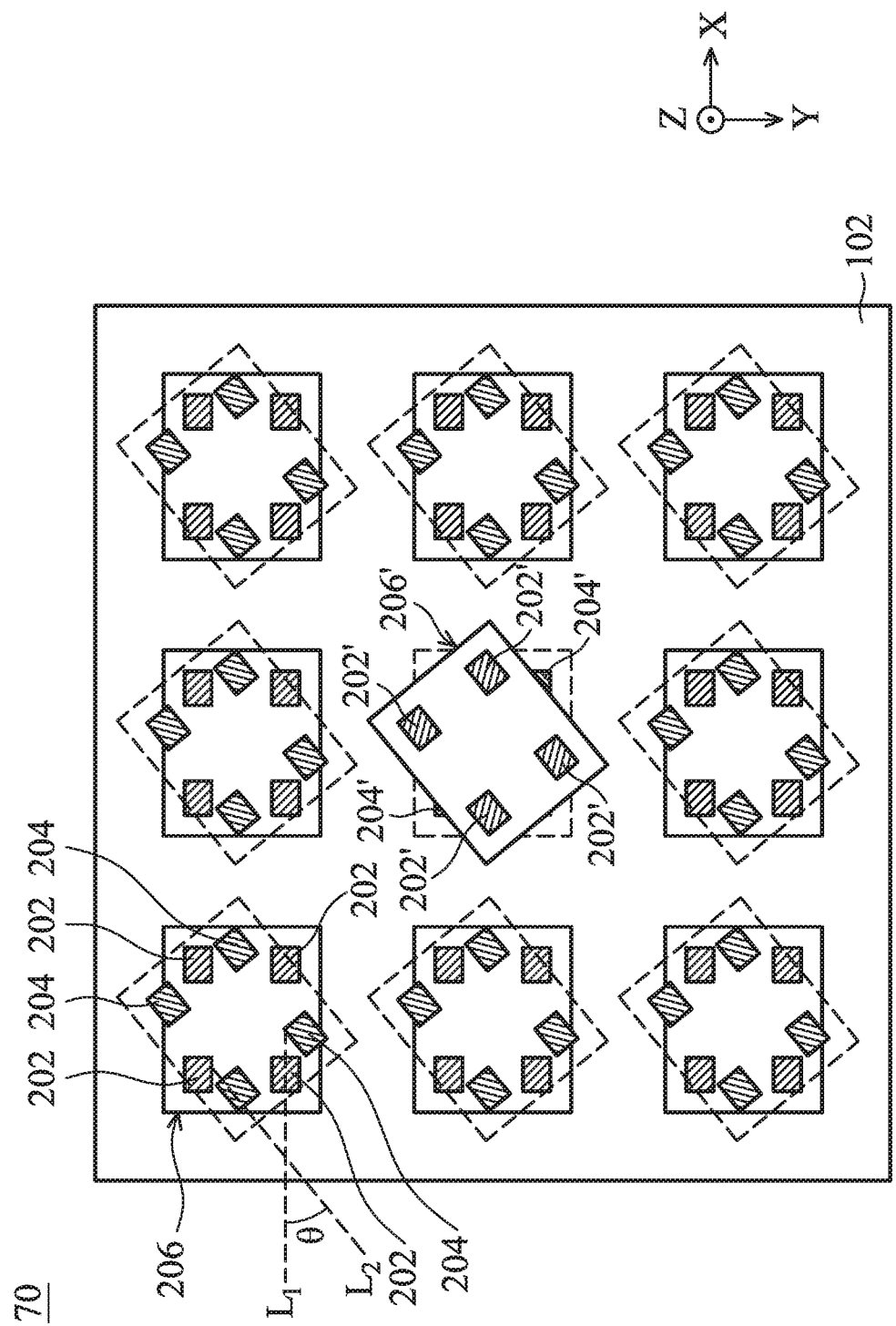
FIG. 8 is a top-view diagram of a portion of the display device in accordance with some embodiments of the present disclosure.

Next, FIG. 8 illustrates a top-view diagram of a portion of the display device 70 in accordance with some embodiments of the present disclosure. As shown in FIG. 8, the redundant pads 204 may be rotated so that there is an acute angle θ between the redundant pads 204 and main pads 202 in accordance with some embodiments. Specifically, the main pads 202 may extend along a first longitudinal direction $L_1$ and the redundant pads 204 may extend along a second longitudinal direction $L_2$. In some embodiments, the acute angle θ between the first longitudinal direction $L_1$ and the second longitudinal direction $L_2$ is in a range from 5 degrees to 85 degrees or from about 30 degrees to about 60 degrees. With such a configuration, the area required for the arrangement of the main pads 202 and the redundant pads 204 may be reduced. In some embodiments, the main pads 202 and the redundant pads 204 may be disposed on different horizontal planes or different metal layers. (as shown in FIG. 7A). In some embodiments, the main pads 202 and the redundant pads 204 may be disposed on the same horizontal plane or the same metal layer. In some embodiments, the main pads 202 and the redundant pads 204 may be formed by different processes (e.g., different deposition processes or different lithography processes).

As shown in FIG. 8, the light-emitting device 206 may be disposed on the unrotated main pads 202 while the redundant pads 204 are rotated in accordance with some embodiments. In some embodiments, the light-emitting device 206 disposed on the unrotated main pads 202 is removed and a new one is disposed on the original position of the rotated redundant pads 204, which serves as the new main pads. The dislocated light-emitting device 206' is disposed on the newly-defined main pads, i.e. the dislocated main pads 202' which are rotated.

Figure 9:
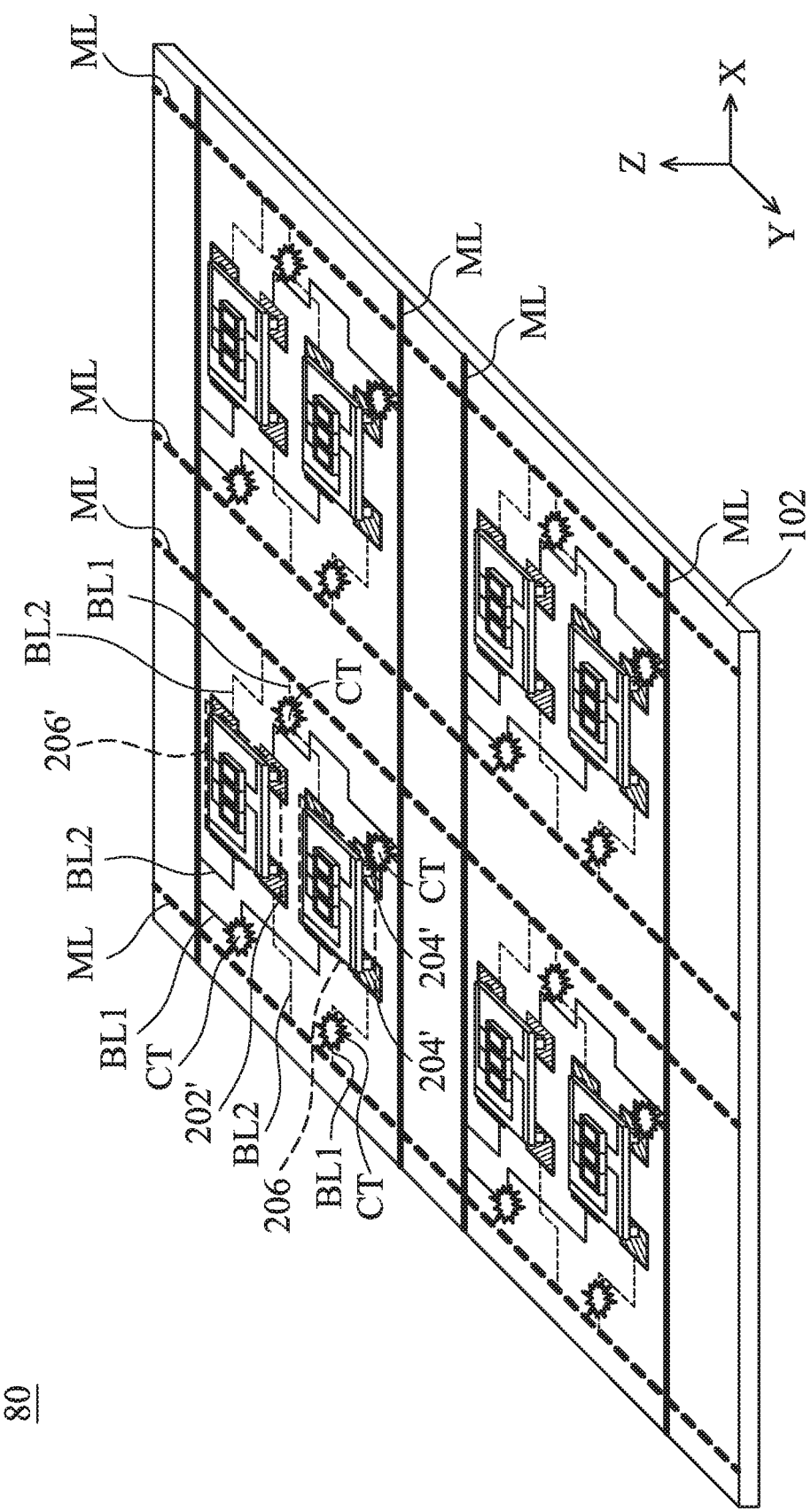
FIG. 9 is a diagram of a portion of the display device in accordance with some embodiments of the present disclosure.

Next, FIG. 9 illustrates a portion of the display device 80 in accordance with some embodiments of the present disclosure. As shown in FIG. 9, the display device 80 includes both the dysfunctional light-emitting devices 206 and the dislocated light-emitting devices 206' disposed in the display unit 200. In this embodiment, the dysfunctional light-emitting devices 206 are not removed, and are left on the first substrate 102, and new ones are disposed on the newly-defined main pads, i.e. the dislocated main pads 202'. The dislocated main pads 202' are electrically connected to the second branch lines BL2, and the dislocated light-emitting devices 206' are disposed on the dislocated main pads 202'. In addition, as shown in FIG. 9, the first branch lines BL1 that were electrically connected to the newly-defined redundant pads 204' (the original main pads) are cut off (indicated as CT in FIG. 9). The dysfunctional light-emitting devices 206 are disposed on the redundant pads 204'. In other words, the dysfunctional light-emitting devices 206 are not electrically connected to the first branch lines BL. In some embodiments, a laser cutting process may be performed to cut off the first branch lines BL1.

Figure 10:
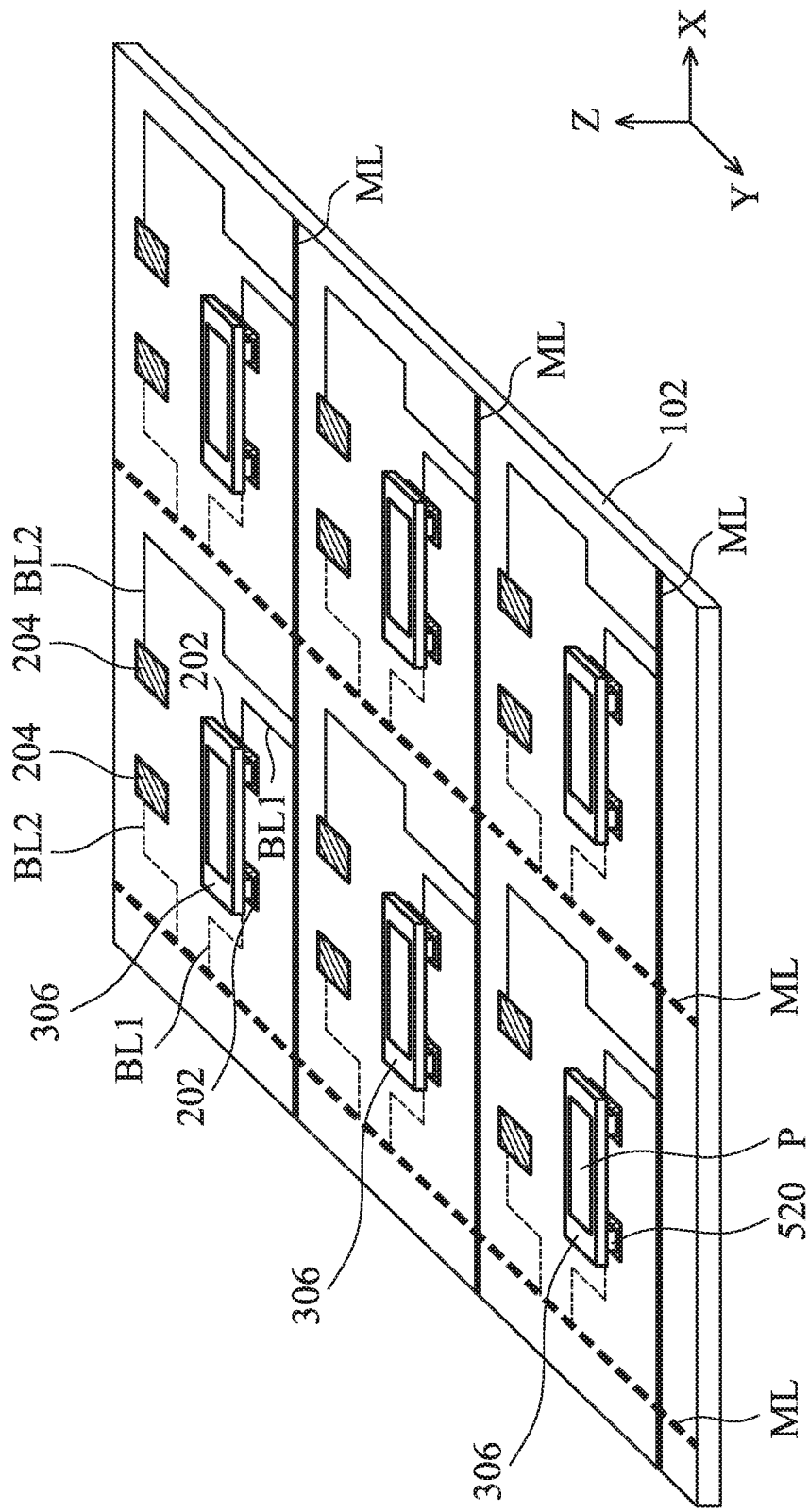
FIG. 10 is a diagram of a portion of the display device in accordance with some embodiments of the present disclosure.

Next, FIG. 10 illustrates a portion of the display device 90 in accordance with some embodiments of the present disclosure. As shown in FIG. 10, the light-emitting device may be formed of a single flip-chip die in accordance with some embodiments. In this embodiment, the pixel region P of the light-emitting device 306 may have one subpixel. The light-emitting device 306 disposed in the different display units 200 may include the pixels for emitting the lights of different colors in accordance with some embodiments. In this embodiment, since the light-emitting device 306 is formed of a single flip-chip die, the light-emitting device 306 may include two connecting posts 520 for electrical connection. Therefore, the display unit 200 may include two main pads 202 disposed on the first substrate 102 to electrically connect with the first branch line BL1 in this embodiment. In some other embodiments, the light-emitting device 306 may be formed of a vertical-type die.

Next, FIG. 11A illustrates a cross-sectional diagram of the display device 10 along the line segment A-A' in FIG. 1. It should be understood that some of the elements such as the wavelength conversion layer and the light-shielding layer etc. are omitted in FIG. 1 for clarity, and these elements will be described in detail in the following context. As shown in FIG. 11A, the display device 10 may include three light-emitting units 206U and each of them may correspond to one subpixel in the display unit 200. The light-emitting unit 206U may include the first substrate 102, the light-emitting device 206 disposed on the first substrate 102 and a wavelength conversion layer disposed on the light-emitting device 206 and so on. Specifically, the light-emitting device 206 may include a first semiconductor layer 502, a second semiconductor layer 506 and a quantum well layer 504 disposed between the first semiconductor layer 502 and second semiconductor layer 506.

In some embodiments, the first semiconductor layer 502 may be made of the III-V compounds having dopants of the first conductivity type, e.g. gallium nitride having p-type conductivity (p-GaN). In some embodiments, the quantum well layer 504 may include a homogeneous interface, a heterogeneous interface, a single quantum well (SQW) or a multiple quantum well (MQW). The material of the quantum well layer 504 may include, but is not limited to, indium gallium nitride, a gallium nitride or a combination thereof. In some embodiments, the second semiconductor layer 506 may be made of the III-V compounds having dopants of the second conductivity type that is different from the first conductivity type, e.g. gallium nitride having n-type conductivity (n-GaN). In addition, the above III-V compounds may include, but is not limited to, indium nitride (InN), aluminum nitride (AlN), indium gallium nitride (InGaN), aluminum gallium nitride (AlGaN), aluminum indium gallium nitride (AlGaInN) or a combination thereof.

In some embodiments, the first semiconductor layer 502, the quantum well layer 504 and the second semiconductor layer 506 may be formed by using an epitaxial growth process. For example, the epitaxial growth process may include metal organic chemical vapor deposition (MOCVD), molecular beam epitaxy (MBE), hydride vapor phase epitaxy (HVPE), liquid phase epitaxy (LPE), any other suitable processes or a combination thereof.

The light-emitting device 206 may further include a first electrode 508 and a second electrode 510. The first electrode 508 and the second electrode 510 may serve as the n-electrode p-electrode of the light-emitting device 206. In some embodiments, the first electrode 508 and the second electrode 510 may be made of a conductive material. The conductive material may include, but is not limited to, copper, aluminum, tungsten, titanium, gold, silver, molybdenum, platinum, nickel, copper alloys, aluminum alloys, tungsten alloys, titanium alloys, gold alloys, silver alloys, molybdenum alloys, platinum alloys, nickel alloys, any other suitable conductive materials, or a combination thereof. In some embodiments, the first electrode 508 and the second electrode 510 may be formed by using chemical vapor deposition, physical vapor deposition, electroplating process, electroless plating process, any other suitable processes, or a combination thereof.

In addition, the light-emitting device 206 may further include a first insulating layer 512, a second insulating layer 514 and a third insulating layer 516 to provide electrical insulation between different elements. In some embodiments, the first insulating layer 512, the second insulating layer 514 and the third insulating layer 516 may be made of insulating materials. The insulating materials may include, but are not limited to, silicon nitride, silicon oxide, silicon oxynitride, any other suitable materials or a combination thereof. In some embodiments, the first insulating layer 512, the second insulating layer 514 and the third insulating layer 516 may be formed by using chemical vapor deposition or coating.

The light-emitting device 206 may also include a connecting layer 518 and a connecting post 520 disposed between the second electrode 510 and the main pad 220. The connecting layer 518 and the connecting post 520 may provide electrical connection between the light-emitting device 206 and the main pad 202. In addition, the connecting post 520 may penetrate through an encapsulating layer 522 to contact with the main pad 202. The connecting layer 518 and the connecting post 520 may be made of conductive materials. In some embodiments, conductive materials may include, but are not limited to, copper, aluminum, molybdenum, tungsten, gold, chromium, nickel, copper alloys, aluminum alloys, molybdenum alloys, tungsten alloys, gold alloys, chromium alloys, nickel alloys, any other suitable metallic materials, or a combination thereof. In some embodiments, the connecting layer 518 and the connecting post 520 may be formed by using chemical vapor deposition, physical vapor deposition, electroplating process, electroless plating process, any other suitable processes, or a combination thereof.

In addition, the encapsulating layer 522 may be made of organic material, inorganic material, or combinations thereof. In some embodiments, the inorganic material may include, but is not limited to, silicon nitride, silicon oxide, silicon oxynitride, aluminum oxide, any other suitable materials, or a combination thereof. In some embodiments, the organic material may include, but is not limited to, epoxy resins, acrylic resins such as polymethylmetacrylate (PMMA), benzocyclobutene (BCB), polyimide, and polyester, polydimethylsiloxane (PDMS), polyfluoroalkoxy (PFA), epoxy, any other suitable materials, or a combination thereof. In some embodiments, the encapsulating layer 522 may be formed by using chemical vapor deposition, spin coating, printing or a combination thereof.

In addition, the light-emitting unit 206U may further include a second substrate 402 disposed opposite to the first substrate 102 and a wavelength conversion layer (e.g., including the wavelength conversion layers 404R, 404G and 404B) disposed between the encapsulating layer 522 and the second substrate 402. The second substrate 402 may serve as a cover substrate. The wavelength conversion layers 404R, 404G and 404B may convert the light emitted from the quantum well layer 504 into the colors that are needed. For example, the wavelength conversion layers 404R, 404G and 404B may convert the light emitted from the quantum well layer 504 into red light, green light and blue light in accordance with embodiments.

In some embodiments, the quantum well layer 504 may emit white light, blue light or UV light. In the embodiments where the quantum well layer 504 emits UV light, the wavelength conversion layers 404R, 404G and 404B may further include the quantum dot layers (not illustrated). The quantum dot layer may include polymer or glass matrix and quantum dot materials. The quantum dot material may have a core-shell structure. The core structure may include, but is not limited to, CdSe, CdTe, CdS, ZnS, ZnSe, ZnO, ZnTe, InAs, InP, GaP, or any other suitable materials, or a combination thereof. The shell structure may include, but is not limited to, ZnS, ZnSe, GaN, GaP, or any other suitable materials, or a combination thereof.

In addition, the light-emitting unit 206U may further include the light-shielding layer 406 disposed adjacent to the wavelength conversion layers 404R, 404G and 404B to enhance the contrast of luminance. In some embodiments, the light-shielding layer 406 may be made of opaque materials such as a black matrix material. The black matrix material may be made of organic resins, glass pastes or a combination thereof. The black matrix material may further include, but is not limited to, black pigments, metallic particles (e.g. particles of nickel, aluminum, molybdenum, or alloys thereof), metal oxide particles (e.g. particles of chromium oxide), or metal nitride particles (e.g. particles of chromium nitride). In some embodiments, the wavelength conversion layer 404 and the light-shielding layer 406 may be formed by using chemical vapor deposition, coating or printing.

In some embodiments, the light-emitting unit 206U may further include a protecting layer 408 overlying or disposed on the wavelength conversion layers 404R, 404G and 404B, and the light-shielding layer 406. The protecting layer 408 may prevent the wavelength conversion layer and the light-shielding layer 406 from being affected by the outer environment. The protecting layer 408 may be made of organic materials or inorganic materials. In some embodiments, the inorganic material may include, but is not limited to, silicon nitride, silicon oxide, silicon oxynitride, aluminum oxide, any other suitable protective materials, or a combination thereof. In some embodiments, the organic material may include, but is not limited to, epoxy resins, acrylic resins such as polymethylmetacrylate (PMMA), benzocyclobutene (BCB), polyimide, and polyester, polydimethylsiloxane (PDMS), any other suitable protective materials, or a combination thereof.

In addition, the light-emitting unit 206U may further include a buffer layer 410 disposed between the protecting layer 408 and the encapsulating layer 522. The buffer layer 410 may cover the second semiconductor layer 506. The buffer layer 410 may prevent the current or heat produced by the light-emitting device 206 from affecting the wavelength conversion layer. In some embodiments, the buffer layer 410 may be adhesive so that the protecting layer 408 may be affixed to the light-emitting device 206. The buffer layer 410 may be made of organic materials or inorganic materials. The organic insulating material may include, but is not limited to, polyamide, polyethylene, polystyrene, polypropylene, polyester, polyimide, polyurethane, silicones, polyacrylate, benzo-cyclo-butene (BCB), polyvinylpyrrolidone (PVP), polyvinylfluoride (PVF), polyvinylidene fluoride (PVDF), polytetrafluoroethylene (PTFE), polymethylmetacrylate (PMMA), polydimethylsiloxane (PDMS), or a combination thereof. The inorganic insulating material may include, but is not limited to, silicon nitride, silicon oxide, silicon oxynitride, aluminum oxide, or a combination thereof. In some embodiments, the buffer layer 410 may be formed by using chemical vapor deposition or coating.

On the other hand, the light-emitting unit 206U may also include an adhesive layer 524 disposed between the light-emitting device 206 and the first substrate 102. Specifically, the adhesive layer 524 may be disposed between the encapsulating layer 522 and the first substrate 102 so that the light-emitting device 206 may be affixed to the first substrate 102. The adhesive layer 524 may be formed of any suitable adhesive material.

As shown in FIG. 11A, each area of the wavelength conversion layers 404R, 404G, 404B may be greater than the area of the quantum well layer 504. Specifically, the areas of the wavelength conversion layers 404R, 404G and 404B are greater than the areas of the quantum well layer 504 in each light-emitting unit 206U respectively. For example, as shown in FIG. 11A, the area A1 of the wavelength conversion layer 404R is greater than the area A2 of the quantum well layer 504. In addition, the wavelength conversion layer 404R, 404G or 404B may partially overlap the main pads 202. In some embodiments, the wavelength conversion layer 404R, 404G or 404B may at least partially overlap the redundant pads 204. In some embodiment, the area A1 is the area of the top surface (close to the second substrate 402) of the wavelength conversion layer from the perspective of the Z direction. The area A2 is the area of the top surface (close to the second substrate 402) of the quantum well layer 504 from the perspective of the Z direction.

Figure 11B:
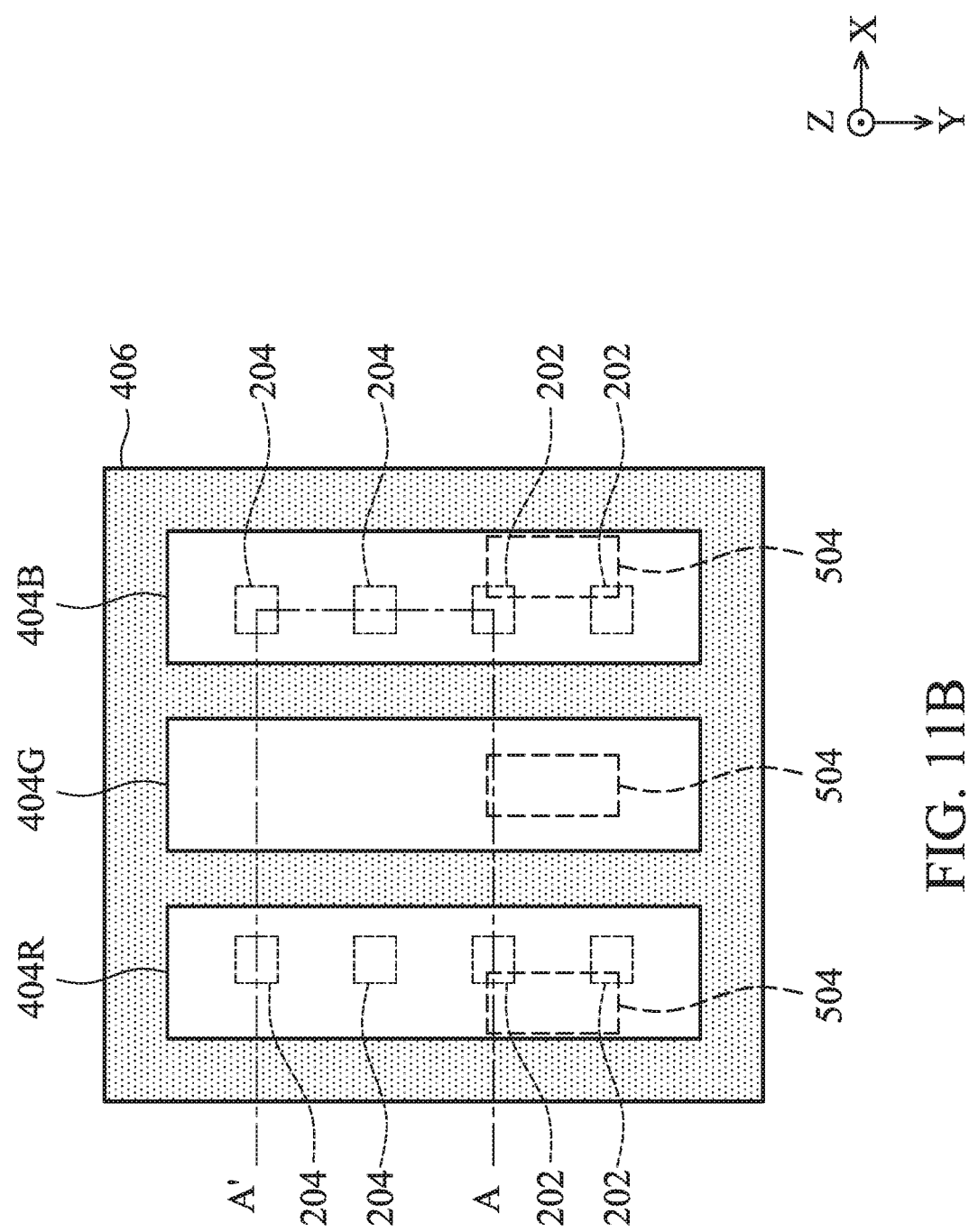
FIG. 11B is a top-view diagram of a portion of the display device in FIG. 1.

In addition, FIG. 11B illustrates a top-view diagram of a portion of the display device 10 in FIG. 1, which includes the line segment A-A' and also corresponds to the portion illustrated in FIG. 11A. As shown in FIG. 11B, the area of the wavelength conversion layer 404R, 404G or 404B is greater than the area of the quantum well layer 504 in each light-emitting unit 206U. Moreover, with such a configuration, the wavelength conversion layers 404R, 404G and 404B would not have to align with the light-emitting unit 206U when the redundant pads 204 are used.

Figure 12:
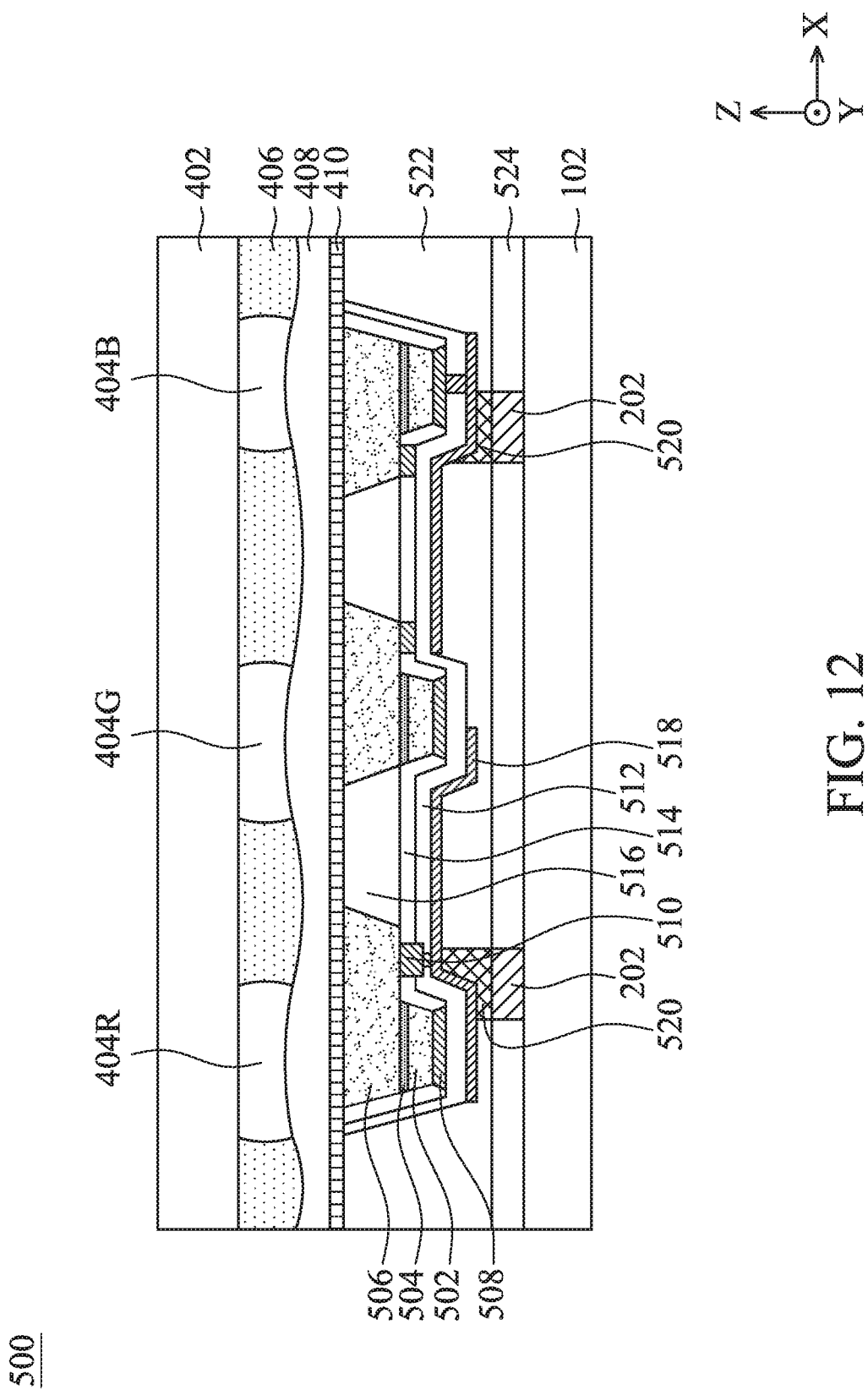
FIG. 12 is a cross-sectional diagram of a portion of the display device in accordance with some embodiments of the present disclosure.

Next, FIG. 12 illustrates a cross-sectional diagram of a portion of the display device 500 in accordance with some embodiments of the present disclosure. FIG. 12 illustrates the cross-sectional diagram of the display device 500 in an aspect similar to the line segment B-B' shown in FIG. 1. As shown in FIG. 12, the second semiconductor layer 506 may partially overlap the light-shielding layer 406 in accordance with some embodiments. Specifically, the second semiconductor layer 506 may partially overlap the light-shielding layer 406 in the Z direction as shown in FIG. 12. In addition, the first semiconductor layer 502 may at least partially overlap the wavelength conversion layers 404R, 404G or 404B in each light-emitting unit 206U in accordance with some embodiments. In some embodiments, wavelength conversion layers 404R, 404G or 404B may entirely cover the first semiconductor layer 502. In some embodiments, the light-shielding layer 406 may also partially overlap the second electrode 510. With such a configuration, the wavelength conversion layers 404R, 404G and 404B may align with the quantum well layer 504 precisely. Therefore, the reflection of the first electrode 508 or the second electrode 510 may be reduced.

Figure 13:
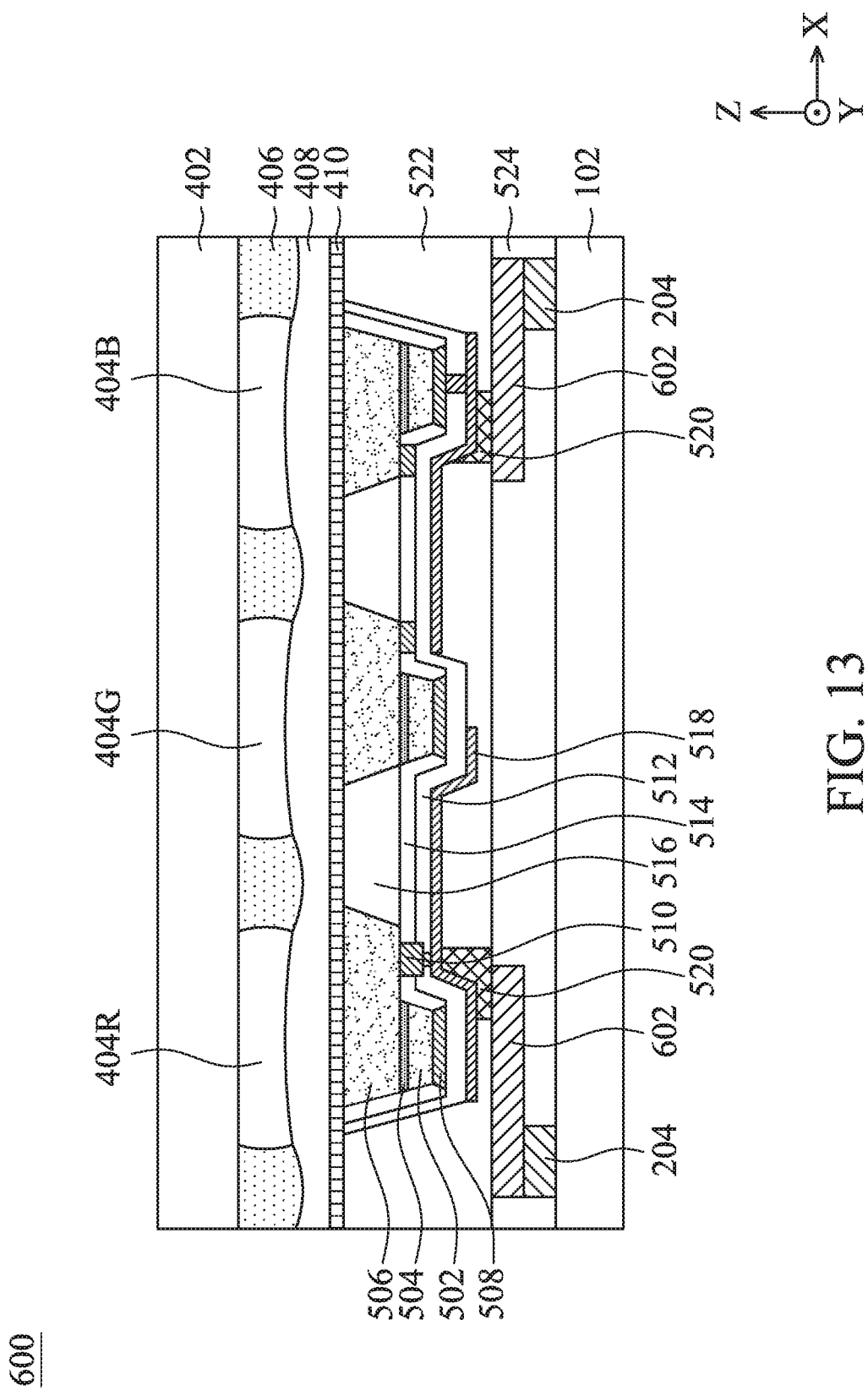
FIG. 13 is a cross-sectional diagram of a portion of the display device in accordance with some embodiments of the present disclosure.

Next, FIG. 13 illustrates a cross-sectional diagram of a portion of the display device 600 in accordance with some embodiments of the present disclosure. FIG. 13 illustrates the cross-sectional diagram of the display device 600 in an aspect similar to the line segment B-B' shown in FIG. 1. The difference between the display device 600 in FIG. 13 and the display device 500 in FIG. 12 is that the display device 600 further includes a connecting pad 602 disposed between the connecting post 520 and the main pad 20 in the embodiment shown in FIG. 13. The connecting pad 602 may extend from the bottom of the connecting post 520 toward the main pad 202 along the X direction (e.g., along the direction that is substantially parallel to the top surface of the first substrate 102). The connecting pad 602 may extend outward to partially overlap the light-shielding layer 406 in accordance with some embodiments. In some embodiments, the main pad 202 may partially overlap the light-shielding layer 406. In some embodiments, the light-shielding layer 406 may entirely cover the main pad 202. In addition, as shown in FIG. 13, the connecting post 520 may partially overlap the connecting pad 602 in accordance with some embodiments. In some embodiments, the connecting post 520 may entirely overlap the connecting pad 602. With the configuration described above, the risk of short occurring near the contact position of the connecting post 520 and the main pad 202 may be reduced. The connecting pad 602 may be made of a conductive material. In some embodiments, the connecting pad 602 may be made of the materials similar to that of the connecting post 520 or the main pad 202.

To summarize the above, the present disclosure provides a display structure including the design of main pads and redundant pads for electrical connection between the integrated light-emitting device and the destination substrate. The redundant pads may serve as spare pads in case the electrical connection between the main pad and a light-emitting device is dysfunctional or damaged. With such a configuration, the repair and replacement of the damaged light-emitting device may become effective. In addition, in accordance with some embodiments of the present disclosure, the dies that correspond to the subpixels of the display device may be packaged together before they are transferred to the destination substrate so that the time required for the transfer may be reduced.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes an individual embodiment, and the claimed scope of the present disclosure also includes the combinations of the claims and embodiments. The features of the various embodiments can be used in any combination as long as they do not depart from the spirit and scope of the present disclosure.

What is claimed is:

1. A display device, comprising:
   a substrate;
   a plurality of signal lines disposed on the substrate, and the plurality of signal lines comprising a first main line and a second main line; and
   a plurality of display units disposed on the substrate, and at least one of the plurality of display units comprising:
   a first main pad and a second main pad;
   a first redundant pad and a second redundant pad; and
   a light-emitting device including a first electrode and a second electrode;
   wherein the first main line is electrically connected to the first electrode of the light-emitting device, the first main pad and the first redundant pad, and the second main line is electrically connected to the second electrode of the light-emitting device, the second main pad and the second redundant pad.

2. The display device as claimed in claim 1, wherein the first main line provides a first signal for the first electrode of the light-emitting device, and the second main line provides a second signal for the second electrode of the light-emitting device.

3. The display device as claimed in claim 2, wherein the first electrode is an n-electrode and the second electrode is a p-electrode.

4. The display device as claimed in claim 3, wherein the light-emitting device corresponds to a pixel region comprising a plurality of subpixels, the plurality of subpixels share the second electrode.

5. The display device as claimed in claim 3, wherein the light-emitting device corresponds to a pixel region comprising one subpixel, and the subpixel is electrically connected to the first electrode and the second electrode.

6. The display device as claimed in claim 1, wherein the first main pad and the first redundant pad are disposed on different metal layers.

7. The display device as claimed in claim 6, wherein the first main pad partially overlaps the first redundant pad.

8. The display device as claimed in claim 6, wherein the at least one of the plurality of display units further comprises:
   a wavelength conversion layer disposed over the light-emitting device; and a light-shielding layer disposed adjacent to the wavelength conversion layer; and wherein the light-emitting device further comprises:

a first semiconductor layer;

a second semiconductor layer disposed on the first semiconductor layer; and a quantum well layer disposed between the first semiconductor layer and the second semiconductor layer.

9. The display device as claimed in claim 8, wherein an area of the wavelength conversion layer is greater than an area of the quantum well layer.

10. The display device as claimed in claim 8, wherein the second semiconductor layer partially overlaps the light-shielding layer.

11. The display device as claimed in claim 8, wherein the first semiconductor layer at least partially overlaps the wavelength conversion layer.

12. The display device as claimed in claim 8, wherein the first main pad at least partially overlaps the light-shielding layer.

13. The display device as claimed in claim 8, wherein the first redundant pad at least partially overlaps the wavelength conversion layer.

14. The display device as claimed in claim 1, wherein a minimum distance between the first main pad and the first redundant pads is less than half of a minimum distance between the first main pad in one of the plurality of display units and the first main pad in another one of the plurality of display units.

15. The display device as claimed in claim 1, wherein an area of the first main pad is different from an area of the first redundant pad.

16. The display device as claimed in claim 1, wherein the first main pad extends along a first longitudinal direction and the first redundant pad extends along a second longitudinal direction, wherein an acute angle between the first longitudinal direction and the second longitudinal direction is in a range from 5 degrees to 85 degrees.

* * * * *